United States Patent
Berry et al.

(10) Patent No.: US 11,289,577 B2
(45) Date of Patent: Mar. 29, 2022

(54) DIRECT FORMATION OF HEXAGONAL BORON NITRIDE ON SILICON BASED DIELECTRICS

(71) Applicants: GlobalWafers Co., Ltd., Hsinchu (TW); Board of Trustees of the University of Illinois, Chicago, IL (US)

(72) Inventors: Vikas Berry, Chicago, IL (US); Sanjay Behura, Chicago, IL (US); Phong Nguyen, Witchita, KS (US); Michael R. Seacrist, Lake St. Louis, MO (US)

(73) Assignees: GlobalWafers Co., Ltd., Hsinchu (TW); Board of the Trustees of the University of Illinois, Chicago, IL (US)

( * ) Notice: Subject to any disclaimer, the term of this patent is extended or adjusted under 35 U.S.C. 154(b) by 0 days.

(21) Appl. No.: 16/726,406

(22) Filed: Dec. 24, 2019

(65) Prior Publication Data
US 2020/0152745 A1    May 14, 2020

Related U.S. Application Data

(62) Division of application No. 16/094,141, filed as application No. PCT/US2017/030124 on Apr. 28, 2017, now Pat. No. 10,658,472.

(Continued)

(51) Int. Cl.
*H01L 29/267* (2006.01)
*H01L 21/02* (2006.01)
(Continued)

(52) U.S. Cl.
CPC ........ *H01L 29/267* (2013.01); *H01L 21/0254* (2013.01); *H01L 21/0262* (2013.01);
(Continued)

(58) Field of Classification Search
CPC ......... H01L 21/02658; H01L 21/02502; H01L 21/02458; H01L 21/02118;
(Continued)

(56) References Cited

U.S. PATENT DOCUMENTS

| 6,277,348 | B1 | 8/2001 | Pujol et al. |
| 6,740,977 | B2 | 5/2004 | Ahn |

(Continued)

FOREIGN PATENT DOCUMENTS

| CN | 102064189 | 5/2011 |
| JP | S61177372 A | 8/1986 |

(Continued)

OTHER PUBLICATIONS

Rohr, C. et al., The growth of hexagonal boron nitride thin films on silicon using single source precursor, Thin Solid Films, 1998, pp. 9-13, vol. 322, No. 1, Elsevier.

(Continued)

*Primary Examiner* — Sonya McCall-Shepard
(74) *Attorney, Agent, or Firm* — Armstrong Teasdale LLP

(57) ABSTRACT

A scalable process for fabricating graphene/hexagonal boron nitride (h-BN) heterostructures is disclosed herein. The process includes $(BN)_xH_y$-radical interfacing with active sites on silicon nitride coated silicon ($Si_3N_4$/Si) surfaces for nucleation and growth of large-area, uniform and ultrathin h-BN directly on $Si_3N_4$/Si substrates (B/N atomic ratio=1: 1.11±0.09). Further, monolayer graphene van der Waals bonded with the produced h-BN surface benefits from h-BN's reduced roughness (3.4 times) in comparison to $Si_3N_4$/Si. Because the reduced surface roughness leads to reduction in surface roughness scattering and charge impurity scattering, therefore an enhanced intrinsic charge carrier mobility (3 folds) for graphene on h-BN/$Si_3N_4$/Si is found.

13 Claims, 13 Drawing Sheets

Related U.S. Application Data

(60) Provisional application No. 62/335,149, filed on May 12, 2016.

(51) Int. Cl.
| | | |
|---|---|---|
| *H01L 29/45* | (2006.01) | |
| *H01L 29/66* | (2006.01) | |
| *H01L 29/786* | (2006.01) | |
| *H01L 21/283* | (2006.01) | |
| *H01L 21/285* | (2006.01) | |

(52) U.S. Cl.
CPC .. *H01L 21/02118* (2013.01); *H01L 21/02318* (2013.01); *H01L 21/02381* (2013.01); *H01L 21/02458* (2013.01); *H01L 21/02488* (2013.01); *H01L 21/02502* (2013.01); *H01L 21/02527* (2013.01); *H01L 21/02609* (2013.01); *H01L 21/02614* (2013.01); *H01L 21/02631* (2013.01); *H01L 21/02658* (2013.01); *H01L 21/283* (2013.01); *H01L 29/45* (2013.01); *H01L 29/66522* (2013.01); *H01L 29/66742* (2013.01); *H01L 29/78681* (2013.01); *H01L 29/78696* (2013.01)

(58) Field of Classification Search
CPC ........... H01L 21/02318; H01L 21/0254; H01L 21/02609; H01L 21/02614; H01L 21/02631; H01L 21/283; H01L 21/02488; H01L 21/02527; H01L 21/0262; H01L 2924/01005

See application file for complete search history.

(56) References Cited

U.S. PATENT DOCUMENTS

| | | | |
|---|---|---|---|
| 8,158,200 | B2 | 4/2012 | Kelber |
| 8,809,855 | B2 | 8/2014 | Yamazaki et al. |
| 8,884,310 | B2 | 11/2014 | Seacrist et al. |
| 9,029,226 | B2 | 5/2015 | Tsai et al. |
| 9,355,842 | B2 | 5/2016 | Secrist et al. |
| 10,099,449 | B2 | 10/2018 | Shin |
| 10,099,499 | B2 | 10/2018 | Shin |
| 2011/0033677 | A1 | 2/2011 | Shin et al. |
| 2011/0042687 | A1 | 2/2011 | Chu et al. |
| 2012/0042992 | A1 | 2/2012 | Kondo et al. |
| 2012/0325296 | A1 | 12/2012 | Woo et al. |
| 2013/0240830 | A1 | 9/2013 | Seacrist et al. |
| 2014/0004656 | A1 | 1/2014 | Sasagawa et al. |
| 2014/0120270 | A1 | 5/2014 | Tour et al. |
| 2014/0234200 | A1 | 8/2014 | Tour et al. |
| 2014/0287244 | A1 | 9/2014 | Shin |
| 2016/0359080 | A1 | 12/2016 | Chae |
| 2017/0133543 | A1 | 5/2017 | Dahal |

FOREIGN PATENT DOCUMENTS

| | | | |
|---|---|---|---|
| JP | S63145779 | A | 6/1988 |
| JP | H03223463 | A | 10/1991 |
| JP | 2002510274 | A | 4/2002 |
| JP | 2004047956 | A | 2/2004 |
| JP | 2007329354 | A | 12/2007 |
| JP | 2009107921 | A | 5/2009 |
| JP | 2009143799 | A | 7/2009 |
| JP | 2009298626 | A | 12/2009 |
| JP | 2011063506 | A | 3/2011 |
| JP | 2013513544 | | 4/2013 |
| JP | 2014090188 | A | 5/2014 |
| JP | 2016058631 | A | 4/2016 |
| KR | 20120084840 | A | 7/2012 |
| KR | 20140082811 | A | 7/2014 |
| KR | 20140115814 | A | 10/2014 |
| WO | 2011075158 | A1 | 6/2011 |

OTHER PUBLICATIONS

Bresnehan, Michael S. et al., Prospects of direct growth boron nitride films as substrates for graphene electronics, Journal of Materials Research, Feb. 14, 2014, pp. 459-471, vol. 29, No. 3.

International Search Report and Written Opinion of the International Searching Authority regarding PCT/US2017/030124 dated Jul. 12, 2017; pp. 1-10.

Su, Ching-Yuan, et al., Direct Formation of Wafer Scale Graphene Thin Layers on Insulating substrates by Chemical Vapor Deposition, NANO Letters, American Chemical Society, Aug. 11, 2011, pp. 3612-3616, vol. 11.

Peng, Zhiwel, et al., Direct Growth of Bilayer Graphene on SiO2 Substrates by Carbon Diffusion though Nickel, ACS Nano, American Chemical Society, 2011, pp. 8241-8247, vol. 5, No. 10.

Geim, A.K. et al., The Rise of Graphene, nature materials, Mar. 2007, pp. 183-191, vol. 6, Nature Publishing Group.

First, Phillip N. et al., Epitaxial Graphenes on Silicon Carbide, MRS Bulletin, Apr. 2010, pp. 296-305, vol. 35, www.mrs.org/bulletin.

Bae, Sukang et al., Roll-to-roll production of 30-inch graphene films for transparent electrodes, Nature Nanotechnology, 2010, pp. 1-7, Macmillan Publishers Limited, www.nature.com/naturenanotechnology.

Yan, Zheng, et al., Growth of Biiayer Graphene on Insulting Substrates, ASC NANO, Just Accepted Manuscripts, Sep. 2, 2011, pp. 20, http://pubs.acs.org.

Berry, Vikas et al., Graphene-Based Single-Bacterium Resolution Biodevice and DNA Transistor: Interfacing Graphene Derivatives with Nanoscale and Microscale Biocomponents, Nano Lett., 2008, pp. 4469-4476, vol. 8, No. 12, ACS Publications, Washington, DC.

Kim, Deun Soo, et al., Large-scale pattern growth of graphene films for stretchable transparent electrodes; Letters, nature, 2009, doi:10.1038/nature07719, p. 1-5.

Reina, Alfonso, Large Area, Few-Layer Graphene Films on Arbitrary Substrates by Chemical Vapor Deposition, Nano Letters, 2009, vol. 9, No. 1, 30-35, ACS Publications, Washington DC.

Li, et al., Synthisis, Characterization, and Properties of Large-Area Graphene Films,ECS Transactions, 2009, pp. 41-51, vol. 19, No. 5,The Electrochemical Society.

Hiroki Ago et al: "Epitaxial Chemical Vapor Deposition Growth of Single-Layer Graphene over Cobalt Film Crystallized on Sapphire", ACS NANO, vol. 4, No. 12, (Dec. 28, 2010), pp. 7407-7414, XP055336545, ISSN: 1936-0851, DOI: 10.1021/nn102519b.

Eunho Kim et al: "Growth of Few-Layer Graphene on a Thin Cobalt Film on a Si/Si02 Substrate", Chemical Vapor Deposition., vol. 17, No. 1-3, (Mar. 24, 2011), pp. 9-14, XP055336568, ISSN: 0948-1907, DOI: 10.1002/cvde.201004296.

Michael E. Ramon et al: "CMOS-Compatible Synthesis of LargeArea, High-Mobility Graphene by Chemical Vapor Deposition of Acetylene on Cobalt Thin Films", ACS NANO, vol. 5, No. 9, (Sep. 27, 2011), pp. 7198-7204, XP055336574, ISSN: 1936-0851, DOI: 10.1021/nn202012m.

Mi Zhou et al: "Fast Track Communication;Direct graphene growth on Co3O4(111) by molecular beam epitaxy; Direct graphene growth on Co3O4(111) by molecular beam epitaxy", Journal of Physics: Condensed Matter, Institute of Physics Publishing, Bristol, GB, vol. 24, No. 7, (Jan. 6, 2012), p. 72201, XP020217753, ISSN: 0953-8984, DOI: 10.1088/0953-8984/24/7/072201.

Li, Xiaoqiang et al., "Graphene/h-BN/GaAs sandwich diode as solar cell and photodetector," Optics Express, vol. 134, #247288 (Jan. 5, 2016).

DIRECT FORMATION OF HEXAGONAL BORON NITRIDE ON SILICON BASED DIELECTRICS

CROSS-REFERENCE TO RELATED APPLICATION

This application is a divisional application of U.S. application Ser. No. 16/094,141, which was filed Oct. 16, 2018, the entire disclosure of which is hereby incorporated by reference in its entirety. U.S. application Ser. No. 16/094,141 is a National Stage application of International Application No. PCT/US2017/030124, filed on Apr. 28, 2017, the entire disclosure of which is hereby incorporated by reference as if set forth in its entirety. International Application No. PCT/US2017/030124 claims priority to U.S. Provisional Patent Application No. 62/335,149 filed on 12 May 2016, the entire disclosure of which is hereby incorporated by reference in its entirety.

FIELD OF THE INVENTION

The field of the invention relates generally to a method for producing graphene and boron nitride hetero-structures on semiconductor substrates.

BACKGROUND OF THE INVENTION

A single atom thick, graphene is the youngest allotrope of carbon and in the last decade it has become most researched material in the scientific community because of its excellent optical, mechanical, and electrical properties. Graphene is the hexagonal arrangement of carbon atoms forming a one-atom thick planar sheet of $sp^2$ hybridized (double bonded) carbon atoms arranged in a honeycomb lattice. Graphene is a promising electronic material. It has the potential to significantly impact the semiconductor industry due to its superior electrical, thermal, mechanical, and optical properties while at the same time offering compatibility with existing semiconductor processing techniques. Graphene has shown extraordinary applications, including single molecule detection, ultrafast field effect transistors (FETs), hydrogen visualization-template for transmission electron microscopy (TEM), and tunable spintronic devices. Furthermore, it exhibits high thermal conductivity (25× silicon), high mechanical strength (strongest nanomaterial), high optical transparency (97.7% for monolayer graphene), carrier controlled interband/optical-transition and flexible structure. Electronically, graphene is a semi-metal with zero band-gap owing to the conduction band touching the valence band at two points (K and K') in the Brillouin zone. Graphene's high density of $\pi$-electrons from the $sp^2$ carbon atoms and carrier-confinement in an open crystallographic structure imparts it with the highest mobility measured to date.

To enhance the charge carrier mobility in interfaced graphene, an atomically smooth, chemically inert and electrically insulator substrate platform is critical. Further, typical silicon-based oxide and nitride substrates are rough and dopant-rich with poor electronic and thermal transport characteristics. See, e.g., Dean, C. R. et al. Boron nitride substrates for high-quality graphene electronics. *Nat Nano* 5, 722-726, (2010); and Geim, A. K. & Grigorieva, I. V. Van der Waals heterostructures. *Nature* 499, 419-425, (2013). In contrast, the wide bandgap hexagonal boron nitride (h-BN) with remarkable physical properties and chemical stability has been recently identified as an ideal gate dielectric for graphene and other two-dimensional nanomaterial (2 DN) electronics, deep ultra-violet emission, thinnest tunneling junction, and high chemically tolerant film (for protective coatings). See, e.g., Kubota, Y., Watanabe, K., Tsuda, O. & Taniguchi, T. Deep Ultraviolet Light-Emitting Hexagonal Boron Nitride Synthesized at Atmospheric Pressure. *Science* 317, 932-934, (2007); Britnell, L. et al. Electron tunneling through ultrathin boron nitride crystalline barriers. *Nano letters* 12, 1707-1710 (2012); Li, L. H., Cervenka, J., Watanabe, K., Taniguchi, T. & Chen, Y. Strong oxidation resistance of atomically thin boron nitride nanosheets. *ACS nano* 8, 1457-1462 (2014). Within each layer of h-BN, boron and nitrogen atoms are bound by strong covalent bonds, whereas the layers are held together by lip-lip interactions in AA' stacks. See, e.g., Blase, X., De Vita, A., Charlier, J. C. & Car, R. Frustration Effects and Microscopic Growth Mechanisms for BN Nanotubes. *Physical Review Letters* 80, 1666-1669 (1998); and Golberg, D. et al. Boron Nitride Nanotubes and Nanosheets. *ACS Nano* 4, 2979-2993, (2010).

Several techniques have been employed to synthesize h-BN, including micromechanical cleavage, chemical exfoliation via ultrasonication, atomic layer deposition and chemical vapor deposition (CVD). The CVD process via decomposition reactions of various BN precursors produces large-area h-BN domains on catalytic metal surfaces. See, e.g., Lee, C. et al. Frictional Characteristics of Atomically Thin Sheets. *Science* 328, 76-80, (2010); Warner, J. H., Rümmeli, M. H., Bachmatiuk, A. & Büchner, B. Atomic Resolution Imaging and Topography of Boron Nitride Sheets Produced by Chemical Exfoliation. *ACS Nano* 4, 1299-1304, (2010); Debbarma, R., Behura, S., Nguyen, P., Sreeprasad, T. S. & Berry, V. Electrical Transport and Network Percolation in Graphene and Boron Nitride Mixed-Platelet Structures. *ACS Applied Materials & Interfaces*, (2016); Olander, J., Ottosson, L. M., Heszler, P., Carlsson, J. O. & Larsson, K. M. E. Laser-Assisted Atomic Layer Deposition of Boron Nitride Thin Films. *Chemical Vapor Deposition* 11, 330-337, (2005); Ferguson, J. D., Weimer, A. W. & George, S. M. Atomic layer deposition of boron nitride using sequential exposures of BCl3 and NH3. *Thin Solid Films* 413, 16-25, (2002); Song, L. et al. Large Scale Growth and Characterization of Atomic Hexagonal Boron Nitride Layers. *Nano Letters* 10, 3209-3215, (2010); Kim, K. K. et al. Synthesis of monolayer hexagonal boron nitride on Cu foil using chemical vapor deposition. *Nano Lett* 12, 161-166, (2012); and Ismach, A. et al. Toward the Controlled Synthesis of Hexagonal Boron Nitride Films. *ACS Nano* 6, 6378-6385, (2012).

Further, the process requires pre-treatment steps such as electrochemical polishing or chemical mechanical polishing and high temperature annealing, respectively. Subsequently, relocating h-BN from metal surfaces to other dielectric substrates requires additional wet/dry transfer process which introduces unintentional surface corrugations and possible adsorption of polymeric impurities on h-BN surface. Therefore, direct, transfer-free and scalable synthesis of h-BN films on dielectric surfaces is critical for 2D electronics and industry-scale applications. See Tay, R. Y. et al. Direct growth of nanocrystalline hexagonal boron nitride films on dielectric substrates. *Applied Physics Letters* 106, 101901, (2015); and Wang, M. et al. A Platform for Large-Scale Graphene Electronics—CVD Growth of Single-Layer Graphene on CVD-Grown Hexagonal Boron Nitride. *Advanced Materials* 25, 2746-2752, (2013).

Limited work has been performed on producing amorphous, nanocrystalline and poly-crystalline h-BN films on SiO$_2$/Si surfaces via thermal and plasma-enhanced CVD. See Li, Q., Jie, Y., Mingyu, L., Fei, L. & Xuedong, B. Catalyst-free growth of mono- and few-atomic-layer boron nitride sheets by chemical vapor deposition. *Nanotechnology* 22, 215602 (2011); Hirayama, M. & Shohno, K. CVD-BN for Boron Diffusion in Si and Its Application to Si Devices. *Journal of The Electrochemical Society* 122, 1671-1676, doi:10.1149/1.2134107 (1975); and Rand, M. J. & Roberts, J. F. Preparation and Properties of Thin Film Boron Nitride. *Journal of The Electrochemical Society* 115, 423-429, doi:10.1149/1.2411238 (1968).

BRIEF DESCRIPTION OF THE INVENTION

Briefly, the present invention is directed to a method of forming a multilayer structure, the method comprising: contacting a front surface of a layer comprising silicon nitride with a boron-containing gas and a nitrogen-containing gas at a temperature sufficient to directly deposit a layer comprising hexagonal boron nitride in interfacial contact with the front surface of the layer comprising silicon nitride.

The present invention is directed to a method of forming a multilayer structure, the method comprising: contacting a front surface of a silicon substrate with a boron-containing gas and a nitrogen-containing gas at a temperature sufficient to directly deposit a layer comprising hexagonal boron nitride in interfacial contact with the front surface of the silicon substrate.

The present invention is further directed to a multilayer structure comprising: a single crystal semiconductor wafer comprising two major, generally parallel surfaces, one of which is a front surface of the single crystal semiconductor wafer and the other of which is a back surface of the single crystal semiconductor wafer, a circumferential edge joining the front and back surfaces of the single crystal semiconductor wafer, a central plane between the front surface and the back surface of the single crystal semiconductor wafer, and a bulk region between the front and back surfaces of the single crystal semiconductor wafer; a layer comprising silicon nitride in interfacial contact with the front surface of the single crystal semiconductor wafer; a layer comprising hexagonal boron nitride in interfacial contact with the layer comprising silicon nitride; and a layer comprising graphene in interfacial contact with the layer comprising hexagonal boron nitride.

BRIEF DESCRIPTION OF THE DRAWINGS

FIG. 5A is a schematic of graphene/h-BN heterostructure device with inset shows the optical microscope image of back-gate field effect transistor (scale bar is 20 µm). FIG. 5B is a graph of conductance vs. carrier concentrations characteristics of graphene/h-BN and graphene/Si$_3$N$_4$ heterostructures at 15 K and $V_{DS}$=5 mV. The top inset shows the carrier mobility values for both the devices at 15 K. FIG. 5C depicts the variation (log-log scale) of conductance with carrier concentration for graphene/h-BN and graphene/Si$_3$N$_4$ heterostructure. FIG. 5D depicts the variation of resistivity with applied bias for graphene/h-BN and graphene/Si$_3$N$_4$ heterostructures at 15 and 300 K. FIG. 5E depicts the variation of field effect mobility with carrier concentration for graphene/h-BN and graphene/Si$_3$N$_4$ heterostructures at 15 K.

DETAILED DESCRIPTION OF THE EMBODIMENT(S) OF THE INVENTION

According to some embodiments of the present invention, a growth mechanism of hexagonal boron nitride is demonstrated, which enhances the quality of hexagonal boron nitride deposited on silicon-based dielectric surfaces, and facilitates the electrical transport properties of graphene/h-BN heterostructures.

By leveraging the (BN)$_x$H$_y$-radicals' interaction with the N-terminated ((100) Si$_3$N$_4$/Si) surface, in some embodiments, the present invention is directed to a method of nitride-assisted radical-attachment and crystallization of large-area, continuous thin films of hexagonal boron nitride (h-BN) on silicon nitride on silicon (Si$_3$N$_4$/Si) surfaces. Further, the process developed here eliminates the need for a metal catalyst for the deposition of h-BN on semiconductor wafer substrates and associated pre-treatment steps as well as post-synthesis transfer steps, further providing an avenue for its possible potential use in several electronic, photonic, composite, and mechanical applications. Furthermore, h-BN modified Si$_3$N$_4$/Si substrates were directly applied for realizing van der Waals heterostructures with monolayer graphene for high mobility electronics. These intimately interfaced, van der Waal bound heterostructures (graphene/h-BN) fabricated, in some embodiments, through all-CVD growth process benefit from 3.4 times reduced roughness of h-BN in comparison to Si$_3$N$_4$/Si surface. Subsequently, this leads to the reduction in surface roughness scattering and charged impurity scattering for the enhancement of intrinsic charge carrier mobility for graphene-based heterostructures. Therefore, an enhanced intrinsic charge carrier mobility of 1200 cm$^2$/Vs for graphene on h-BN/Si$_3$N$_4$/Si is found in contrast to 400 cm$^2$/Vs for graphene on Si$_3$N$_4$/Si. Further, the heterostructures are clean and lacks surface corrugations (e.g., tears, folds, and wrinkles) and residue adsorbates, an important requisite for high speed nanoelectronics. The mechanism behind direct h-BN formations on silicon (Si)-based oxide and nitride surfaces is clearly described via controlled experiments, which is supported by atomistic molecular dynamics (MD) simulations.

I. Substrates for Layer Deposition

Figure 1A:
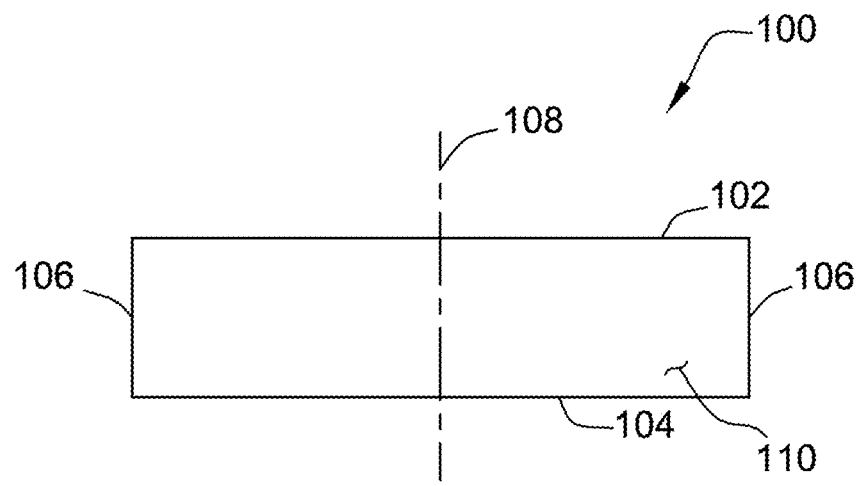
FIGS. 1A through 1E depict a process flow according to some embodiments of the present invention.

According to the method of the present invention, deposition occurs on a semiconductor substrate, i.e., a semiconductor wafer. With reference now to FIG. 1A, an exemplary, non-limiting single crystal semiconductor wafer 100 is depicted. In general, the single crystal semiconductor wafer 100 comprises two major, generally parallel surfaces. One of the parallel surfaces is a front surface 102 of the single crystal semiconductor wafer 100, and the other parallel surface is a back surface 104 of the single crystal semiconductor wafer 100. The single crystal semiconductor wafer 100 comprises a circumferential edge 106 joining the front and back surfaces 102, 104. The single crystal semiconductor wafer 100 comprise a central axis 108 perpendicular to the two major, generally parallel surfaces 102, 104 and also perpendicular to a central plane defined by the points midway between the front and back surfaces 102, 104. The single crystal semiconductor wafer 100 comprises a bulk region 110 between the two major, generally parallel surfaces 102, 104. Since semiconductor wafers, e.g., silicon wafers, typically have some total thickness variation (TTV), warp, and bow, the midpoint between every point on the front surface 102 and every point on the back surface 104 may not precisely fall within a plane. As a practical matter, however, the TTV, warp, and bow are typically so slight that to a close approximation the midpoints can be said to fall within an imaginary central plane which is approximately equidistant between the front and back surfaces. Prior to any operation as described herein, the front surface 102 and the back surface 104 of the single crystal semiconductor wafer 100 may be substantially identical. A surface is referred to as a "front surface" or a "back surface" merely for convenience and generally to distinguish the surface upon which the operations of method of the present invention are performed.

In some embodiments, single crystal semiconductor wafer 100 comprises a material selected from among silicon, silicon carbide, silicon germanium, gallium arsenide, gallium nitride, indium phosphide, indium gallium arsenide, germanium, and combinations thereof. The semiconductor wafer may comprise combinations of such materials, e.g., in a multilayer structure. In general, the semiconductor wafer has a diameter of at least about 20 mm, more typically between about 20 mm and about 500 mm. In some embodiments, the diameter is at least about 20 mm, at least about 45 mm, at least about 90 mm, at least about 100 mm, at least about 150 mm, at least about 200 mm, at least about 250 mm, at least about 300 mm, at least about 350 mm, or even at least about 450 mm. The semiconductor wafer may have a thickness between about 100 micrometers and about 5000 micrometers, such as between about 100 micrometers and about 1500 micrometers, such as between about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers. In some embodiments, the wafer thickness may be about 775 micrometers.

In particularly preferred embodiments, the semiconductor wafer comprises a wafer sliced from a single crystal silicon wafer which has been sliced from a single crystal ingot grown in accordance with conventional Czochralski crystal growing methods. Such methods, as well as standard silicon slicing, lapping, etching, and polishing techniques are disclosed, for example, in F. Shimura, Semiconductor Silicon Crystal Technology, Academic Press, 1989, and Silicon Chemical Etching, (J. Grabmaier ed.) Springer-Verlag, N.Y., 1982 (incorporated herein by reference). Preferably, the wafers are polished and cleaned by standard methods known to those skilled in the art. See, for example, W. C. O'Mara et al., Handbook of Semiconductor Silicon Technology, Noyes Publications. If desired, the wafers can be cleaned, for example, in a standard SC1/SC2 solution. In some embodiments, the single crystal silicon wafers of the present invention are single crystal silicon wafers which have been sliced from a single crystal ingot grown in accordance with conventional Czochralski ("Cz") crystal growing methods, typically having a nominal diameter of at least about 150 mm, at least about 200 mm, at least about 300 mm, or at least about 450 mm. Preferably, both the single crystal silicon wafer and the single crystal silicon donor wafer have mirror-polished front surface finishes that are free from surface defects, such as scratches, large particles, etc. Wafer thickness may vary from between about 100 micrometers and about 5000 micrometers, such as between about 100 micrometers and about 1500 micrometers, such as between about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers. In some embodiments, the wafer thickness may be about 775 micrometers. In some specific embodiments, the wafer thickness may be about 725 micrometers.

In some embodiments, the single crystal semiconductor wafers comprise interstitial oxygen in concentrations that are generally achieved by the Czochralski-growth method. In some embodiments, the single crystal semiconductor wafers comprise oxygen in a concentration between about 4 PPMA and about 18 PPMA. In some embodiments, the semiconductor wafers comprise oxygen in a concentration between about 10 PPMA and about 35 PPMA. In some embodiments, the single crystal silicon wafer comprises oxygen in a concentration of no greater than about 10 PPMA. Interstitial oxygen may be measured according to SEMI MF 1188-1105.

Silicon wafer resistivity is not critical to the method of the present invention. However, resistivity may vary depending upon end use requirements. In view thereof, the wafer may be heavily doped, may be semi-insulating, or may have a doping profile somewhere between. The single crystal semiconductor wafer 100 may have any resistivity obtainable by the Czochralski or float zone methods. The resistivity may therefore vary from milliohm or less to megaohm or more. In some embodiments, the single crystal semiconductor wafer 100 comprises a p-type or an n-type dopant. Suitable dopants include boron (p type), gallium (p type), phosphorus (n type), antimony (n type), and arsenic (n type). The dopant concentration is selected based on the desired resistivity of the wafer. In some embodiments, the single crystal semiconductor wafer comprises a p-type dopant. In some embodiments, the single crystal semiconductor wafer is a single crystal silicon wafer comprising a p-type dopant, such as boron.

In some embodiments, the single crystal semiconductor wafer 100 has a relatively low minimum bulk resistivity, such as below about 100 ohm-cm, below about 50 ohm-cm, below about 1 ohm-cm, below about 0.1 ohm-cm, or even below about 0.01 ohm-cm. In some embodiments, the single crystal semiconductor wafer 100 has a relatively low minimum bulk resistivity, such as below about 100 ohm-cm, or between about 1 ohm-cm and about 100 ohm-cm. Low resistivity wafers may comprise electrically active dopants, such as boron (p type), gallium (p type), phosphorus (n type), antimony (n type), and arsenic (n type). Choice of substrate resistivity depends on application (for example, if the substrate is used as backgate, then lower resistivity is preferred) but should not impact growth of the hBN layer and graphene layer.

In some embodiments, the single crystal semiconductor wafer 100 has a relatively high minimum bulk resistivity. High resistivity wafers are generally sliced from single crystal ingots grown by the Czochralski method or float zone method. High resistivity wafers may comprise electrically active dopants, such as boron (p type), gallium (p type), aluminum (p type), indium (p type), phosphorus (n type), antimony (n type), and arsenic (n type), in generally very low concentrations. Cz-grown silicon wafers may be subjected to a thermal anneal at a temperature ranging from about 600° C. to about 1000° C. in order to annihilate thermal donors caused by oxygen that are incorporated during crystal growth. In some embodiments, the single crystal semiconductor wafer has a minimum bulk resistivity of at least 100 Ohm-cm, or even at least about 500 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 1000 Ohm-cm and about 6000 ohm-cm, between about 2000 Ohm-cm and about 10,000 Ohm-cm, between about 3000 Ohm-cm and about 10,000 Ohm-cm, or between about 3000 Ohm-cm and about 5,000 Ohm-cm. In some preferred embodiments, the single crystal semiconductor substrate has a bulk resistivity between about 1000 Ohm-cm and about 6,000 Ohm-cm. In some preferred embodiments, the single crystal semiconductor substrate comprises an electrically active dopant selected from the group consisting of boron, aluminum, gallium, indium, and any combination thereof. In some preferred embodiments, the single crystal semiconductor wafer comprises boron, which may be present in a concentration less than about $2 \times 10^{13}$ atoms/cm$^3$, less than about $1 \times 10^{13}$ atoms/cm$^3$, such as less than about $5 \times 10^{12}$ atoms/cm$^3$, or less than about $1 \times 10^{12}$ atoms/cm$^3$. Methods for preparing high resistivity wafers are known in the art, and such high resistivity wafers may be obtained from commercial suppliers, such as SunEdison Semiconductor Ltd. (St. Peters, Mo.; formerly MEMC Electronic Materials, Inc.).

The single crystal semiconductor wafer 100 may comprise single crystal silicon. The single crystal semiconductor wafer 100 may have, for example, any of (100), (110), or (111) crystal orientation, and the choice of crystal orientation may be dictated by the end use of the structure.

Figure 1B:
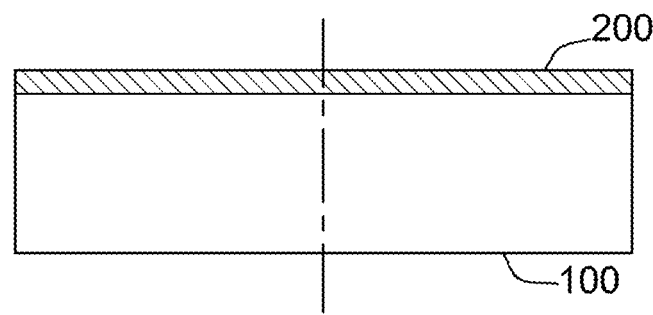

With reference now to FIG. 1B, in some embodiments of the method of the present invention, one or more of the major surfaces of the semiconductor substrate 100 may be modified with a dielectric layer 200. The dielectric layer 200 may comprise silicon dioxide, silicon nitride, silicon oxynitride, or a combination of silicon dioxide, silicon nitride, or silicon oxynitride layers, i.e., in a multilayer.

In some embodiments, the semiconductor substrate 100 comprises a silicon wafer, the front surface layer of which is oxidized. In preferred embodiments wherein the semiconductor substrate 100 comprises a silicon wafer, or a silicon wafer whose front surface is preferably oxidized such that the front surface layer of the silicon wafer comprises a dielectric layer 200 comprising silicon dioxide ($SiO_2$). In some embodiments, the silicon dioxide layer may have a thickness between about 10 nm and about 1000 nm, between about 30 nm and about 1000 nm, between about 50 nm and about 500 nm, preferably between about 50 nm and about 300 nm, such as between about 90 nm and about 300 nanometers thick, or between about 90 nm and about 200 nanometers thick. The front surface of the silicon wafer may be thermally oxidized via wet or dry oxidation, as is known in the art. In some embodiments, the front and back surfaces of the wafers may be thermally oxidized in a furnace such as an ASM A400 or ASM A400XT. Thermal oxidation generally occurs at elevated temperatures, such as between about 800° C. and about 1200° C. Oxidation may be wet (e.g., in a water vapor, such as ultra high purity steam for oxidation, ambient atmosphere) or dry (e.g., in an oxygen gas atmosphere). Optionally, the ambient atmosphere may contain hydrochloric acid, e.g., up to about 10 volume %, to remove surface impurities during oxidation.

In some embodiments, the oxidation layer is relatively thin, such as between about 5 angstroms and about 25 angstroms, such as between about 10 angstroms and about 15 angstroms. Thin oxide layers can be obtained on both sides of a semiconductor wafer by exposure to a standard cleaning solution, such as an SC1/SC2 cleaning solution. In some embodiments, the SC1 solution comprises 5 parts deioinized water, 1 part aqueous $NH_4OH$ (ammonium hydroxide, 29% by weight of $NH_3$), and 1 part of aqueous $H_2O_2$ (hydrogen peroxide, 30%). In some embodiments, the handle wafer may be oxidized by exposure to an aqueous solution comprising an oxidizing agent, such as an SC2 solution. In some embodiments, the SC2 solution comprises 5 parts deioinized water, 1 part aqueous HCl (hydrochloric acid, 39% by weight), and 1 part of aqueous $H_2O_2$ (hydrogen peroxide, 30%).

In some embodiments, the semiconductor substrate 100 may comprise a dielectric layer 200 comprising silicon nitride. In some embodiments, the semiconductor substrate 100 comprises a bare silicon wafer, upon which is deposited a silicon nitride layer. In some embodiments, the semiconductor substrate 100 comprises a silicon wafer, the front surface layer of which is oxidized as described above, which is followed by deposition of a silicon nitride layer. A silicon nitride layer may be deposited on bare silicon or on the silicon dioxide layer since silicon nitride advantageously forms a barrier layer to reduce diffusion of metal atoms, e.g., nickel, into the silicon oxide layer. In some embodiments, the silicon nitride layer may range in thickness between about 10 nm and about 1000 nm, between about 30 nm and about 1000 nm, or from about 50 nanometers to about 1000 nanometers. In some embodiments, the silicon nitride layer may range in thickness from about 50 nanometers to about 500 nanometers. In some embodiments, the silicon nitride layer may range in thickness from about 70 nanometers to about 250 nanometers. The thickness of the silicon nitride layer is determined in view of the trade-off between device performance, such that thinner layers are preferred, and an effective barrier to prevent in-diffusion of impurities into the semiconductor substrate, such that thicker layers are preferred. Silicon nitride may be deposited on silicon or on the surface of the silicon oxide layer by contacting the substrate with an atmosphere of nitrogen and/or ammonia at elevated temperature. For example, the semiconductor may be exposed to nitrogen gas or ammonia at temperatures ranging from about 700° C. to about 1300° C.

In some embodiments, silicon nitride is formed by chemical vapor deposition at about 800° C. In some embodiments, silicon nitride may be deposited by plasma enhanced chemical vapor deposition. The plasma surface activation tool is a commercially available tool, such as those available from EV Group, such as EVG®810LT Low Temp Plasma Activation System. General requirements of a plasma enhanced CVD chamber include a reactor with various electrode designs, power generation electronics, impedance matching network to transfer power to the gas load, mass flow controllers for input gasses, and pressure control systems. Typical systems are vertical tube reactors powered by an inductively coupled RF source. The single crystal semiconductor handle wafer 100 is loaded into the chamber and placed on a heated support chamber. The chamber is evacuated and backfilled with a nitrogen gas source in a carrier gas, such as argon, to a pressure less than atmospheric to thereby create the plasma. Ammonia and/or nitrogen and/or nitric oxide (NO) and/or nitrous oxide ($N_2O$) gas are suitable source gases for plasma nitride treatment. To deposit a silicon nitride plasma film, suitable silicon precursors include methyl silane, silicon tetrahydride (silane), trisilane, disilane, pentasilane, neopentasilane, tetrasilane, dichlorosilane ($SiH_2Cl_2$), trichlorosilane ($SiHCl_3$), silicon tetrachloride ($SiCl_4$), tetra-ethyl orthosilicate ($Si(OCH_2CH_3)_4$), among others. The flow rate ratios of the gaseous silicon precursor and the gaseous oxygen and/or nitrogen precursor may be between about 1/200 and about 1/50, such as about 1/100.

In some embodiments, the PECVD deposition, particularly of silicon nitride layers, may be enhanced by microwave excitation. Microwave excited PECVD is advantageous since the discharge region can be separated from the reaction region, which results in a lower damage deposited layer. Precursor compounds, e.g., silane and ammonia, are excited by a microwave discharge, e.g., in a 2.45 GHz microwave, and the excited gases diffuse from the plasma chamber to the reaction chamber. Such films may be tuned to be at or near stoichiometry, e.g., $Si_3N_4$.

In some embodiments, deposition may be achieved by low pressure chemical vapor deposition. The LPCVD process can be done in a cold or hot walled quartz tube reactor. Hot walled furnaces allow batch processing and therefore high throughput. They also provide good thermal uniformity, and thus result in uniform films. A disadvantage of hot wall systems is that deposition also occurs on the furnace walls, so that frequent cleaning or replacement of the tube is necessary to avoid flaking of the deposited material and subsequent particle contamination. Cold wall reactors are lower maintenance, as there is no film deposition on the reactor walls. The low pressure chemical vapor silicon nitride may be formed at pressures between about 0.01 Torr and about 100 Torr, such as between about 0.1 Torr and about 1 Torr in a low pressure chemical vapor deposition. Temperatures may range between 425° C. and 900° C. Suitable precursors include those listed for PECVD.

Silicon nitride produced from PECVD is structurally distinct from silicon nitride deposited according to conventional chemical or physical vapor deposition techniques. Conventional CVD or PVD deposition generally results in a silicon nitride layer having a stoichiometry of $Si_3N_4$. Plasma processes can be controlled to deposit a film having a composition such as $Si_xN_yH_z$ depending on the ratios of input reactant gasses, power level, wafer temperature, and overall reactor pressure. Pathways in a plasma system exist to form Si—N, Si=N and Si≡N bonds. This is due to the fact that plasma energies are a hammer that produce $Si_xH_z$ and $N_yH_z$ species. For example, the refractive index and optical gap change dramatically with the Si/N ratio. At higher silane concentrations, the films become Si rich and may reach an index of refraction up to 3.0 (compared to 2 for LPCVD).

In some embodiments, the semiconductor substrate 100 comprising the dielectric layer 200 is cleaned prior to deposition of the layer comprising cobalt, for example to remove organic matter or other impurities. A suitable cleaning solution is the piranha solution, which comprises $H_2SO_4$ (concentrated) and $H_2O_2$ (30% solution), typically in a 3:1 ratio, but other ratios, such as 4:1 or 7:1 are suitable. Cleaning duration is suitably between about 15 minutes and about 2 hours.

II. Hexagonal Boron Nitride Synthesis

Figure 1C:
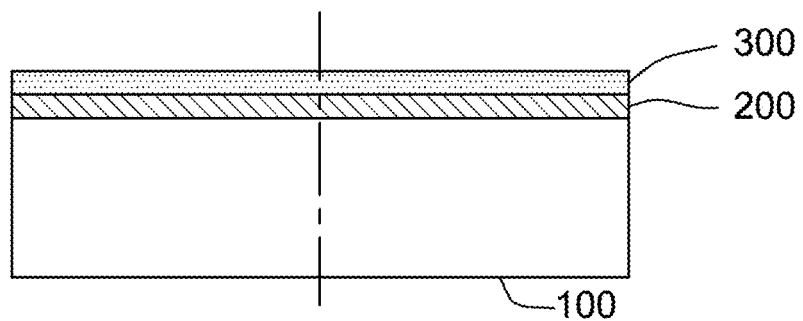

According to some embodiments of the method of the present invention, and with reference to FIG. 1C, a layer 300 comprising hexagonal boron nitride is deposited directly on a front surface of a single crystal semiconductor wafer substrate 100 (e.g., a bare single crystal silicon substrate in which the dielectric layer 200 is not present) or directly on the front surface of a dielectric layer 200, e.g., silicon nitride, on the front surface of a single crystal semiconductor wafer substrate 100. The method of the present invention deposits the layer 300 comprising hexagonal boron nitride on a front surface of a single crystal semiconductor wafer substrate 100 or the dielectric layer 200 without the use of metal catalyst. In some embodiments, the single semiconductor wafer substrate 100 is bare or unmodified with the dielectric layer. In some embodiments, the dielectric layer 200 comprises one or more insulating layers comprising a material selected from the group consisting of silicon dioxide, silicon nitride, silicon oxynitride, and any combination thereof, e.g., in a multilayer. In some embodiments, the dielectric layer has a thickness of at least about 1 nanometer thick, such as between about 1 nanometers and about 10 nanometers, such as between about 10 nanometers and about 10,000 nanometers, between about 10 nanometers and about 5,000 nanometers, between 50 nanometers and about 400 nanometers, or between about 100 nanometers and about 400 nanometers, such as about 50 nanometers, 100 nanometers, or 200 nanometers. In some preferred embodiments, the dielectric layer 200 comprises silicon nitride, and the layer 300 comprising hexagonal boron nitride is directly deposited on silicon nitride. Preferably, the dielectric layer 200 comprising silicon nitride is cleaned of surface oxides prior to deposition, for example, in a piranha solution.

The material for deposition onto the dielectric layer 200 comprises silicon nitride may be deposited by vapor deposition techniques, or gas phase deposition techniques. For example, the layer 300 comprising hexagonal boron nitride may be deposited using metalorganic chemical vapor deposition (MOCVD), physical vapor deposition (PVD), chemical vapor deposition (CVD), low pressure chemical vapor deposition (LPCVD), plasma enhanced chemical vapor deposition (PECVD), or molecular beam epitaxy (MBE). In some preferred embodiments, the layer 300 comprising hexagonal boron nitride may be deposited by low pressure chemical vapor deposition (LPCVD). A suitable instrument is the MTI OTF-1200X. In general, the boron and nitrogen sources are gaseous or vapor at the deposition temperature. Suitable boron sources include diborane ($B_2H_6$), trichloroborane ($BCl_3$), trifluoroborane ($BF_3$), and tetrahydrofuran (THF) solution of borane (THF—$BH_3$). Suitable nitrogen sources include nitrogen, or hydrazine ($N_2H_4$) or ammonia. If separate sources of boron and nitrogen are used, preferably the flow rate of the gases into the CVD chamber is such that the molar ratio of B:N is between about 1.3:1 and 1:1.3, such as between about 1.2:1 and about 1:1.2, or between about 1.1:1 and about 1:1.1, such as about 1:1. In some embodiments, the gas may comprise nitrogen and hydrogen. In some embodiments, the gas may comprise both boron and nitrogen, preferably in a 1:1 ratio, such as borazine ($B_3H_6N_3$), trichloroborazine (e.g., 2,4,6-trichloroborazine, $H_3B_3Cl_3N_3$), aminoborane ($BH_2NH_2$), ammonia borane ($BH_3$—$NH_3$), ammonia borane complex ($H_3N$—$BH_3$), borazine ($B_3N_3H_6$), the diammoniate of diborane $[(NH_3)_2BH_2]^+[BH_4]^-$ and BN polymer complex (polyborazylene). In addition to these carriers, the gaseous atmosphere may comprise inert carrier gases, such as helium and argon. Hydrogen with appropriate flow rate can also be as a carrier gas.

The LPCVD is carried out by heating the, optionally cleaned, substrates to the appropriate temperature in the CVD chamber, which may be at least about 800° C., such as at least about 900° C., at least about 1000° C., such as about 1100° C. in ultra-high vacuum environment (such as between about $10^{-3}$ and about $10^{-6}$ torr), or an inert gas, such as argon or hydrogen. The source gas is then transported into the chamber. Solid source gases may be heated as appropriate to evaporate or sublime the source gas, such as by heating ammonia borane to a temperature above 100° C. Liquid source gases may be bubbled into the chamber with carried gas (Ar and $H_2$). Hexagonal boron nitride deposition may occur at reduced pressure, such as below about 250 Torr, or at a pressure between about $10^{-6}$ torr and about 10 Torr. The reaction time may be between about 5 minutes and about 72 hours, such as between about 5 minutes and 120 minutes, such as from about 15 minutes to about 60 minutes, or between about 1 hour and about 72 hours. After the desired deposition duration, the substrate is slow cooled such as at maximal rate of 40° C./min or quickly cooled, such as at a rate of at least about 40° C./min, or at about 100° C./minute. In some embodiments, a single monoatomic layer of hexagonal boron nitride is deposited. In some embodiments, multiple layers of mono-atomic hexagonal boron nitride are deposited, such as at least two layers of mono-atomic hexagonal boron nitride, such as between two and about 100 layers of mono-atomic hexagonal boron nitride, or between two and about 50 layers of mono-atomic hexagonal boron nitride, or between three and about 50 layers of mono-atomic hexagonal boron nitride. The hexagonal boron nitride comprises equimolar concentrations of boron and nitrogen, such that the molar ratio of B:N is between about 1.3:1 and 1:1.3, such as between about 1.2:1 and about 1:1.2, or between about 1.1:1 and about 1:1.1.

Figure 2A:
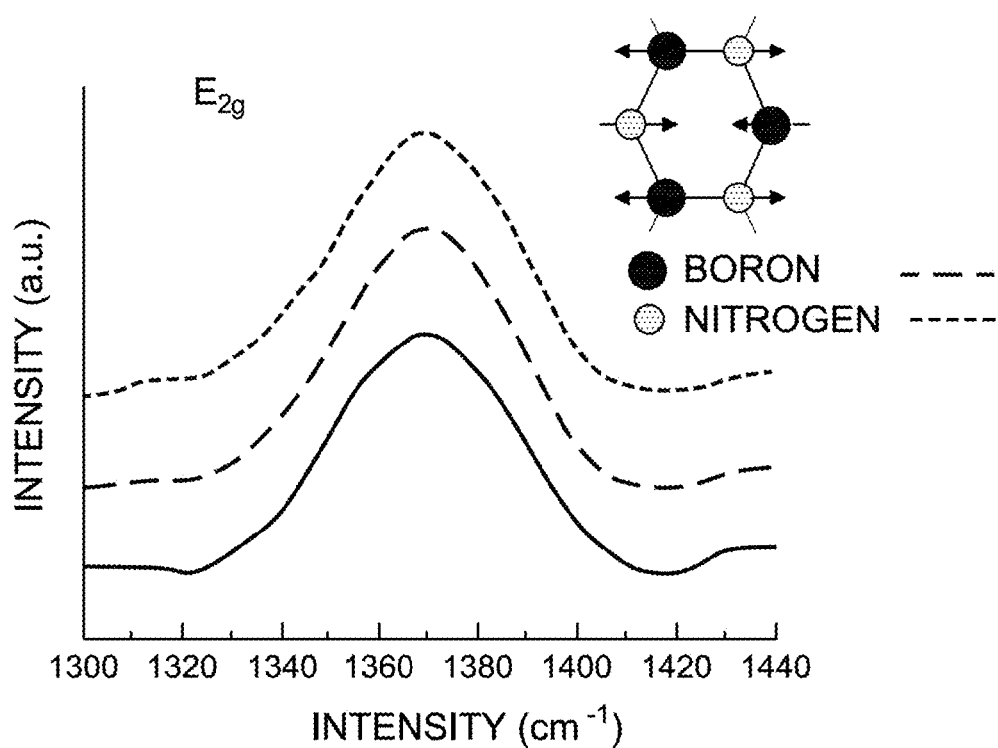
FIG. 2A is a Raman spectra corresponding to h-BN film on Si$_3$N$_4$/Si surface with schematic of phonon mode vibrations (inset).
Figure 2B:
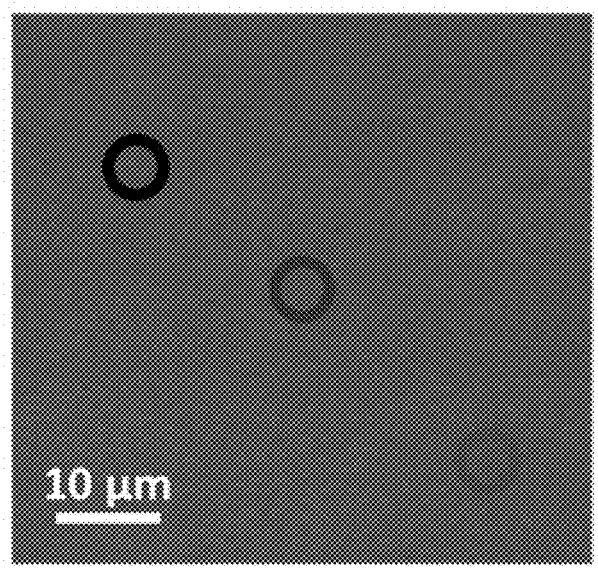
FIG. 2B is an optical microscopic image of h-BN on Si$_3$N$_4$/Si.
Figure 2C:
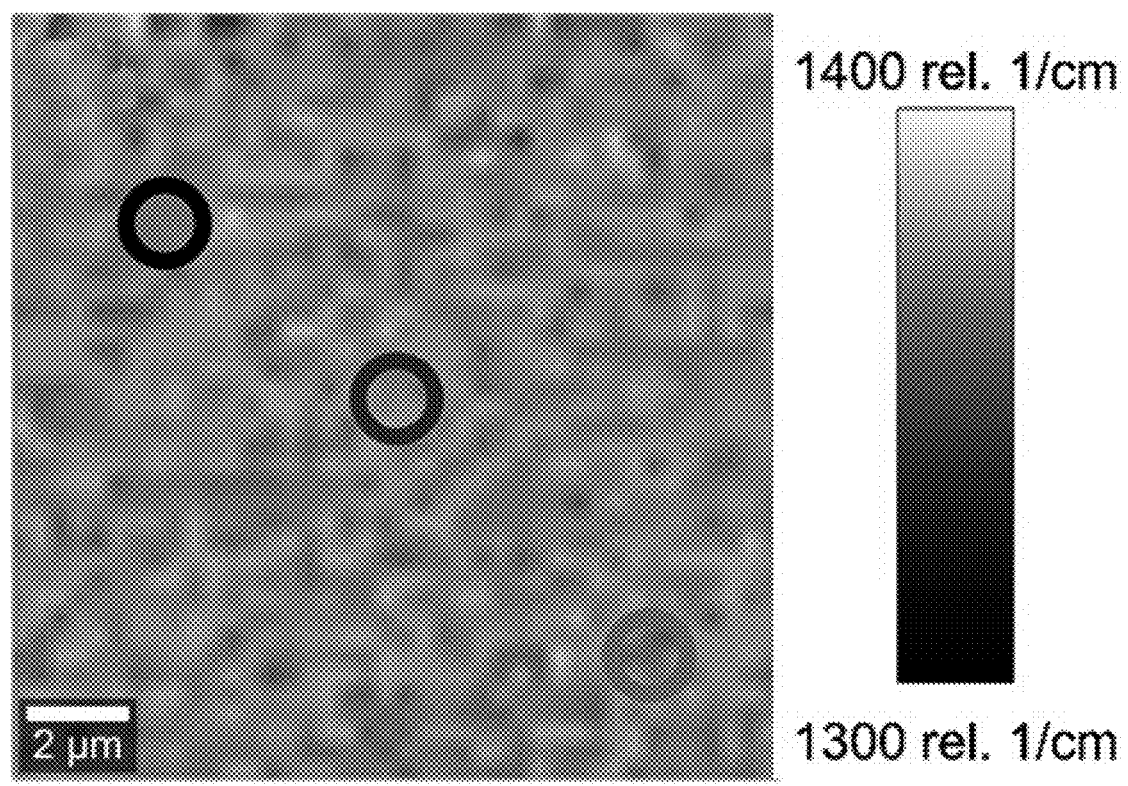
FIG. 2C is the Raman spatial mapping of h-BN on Si$_3$N$_4$/Si surfaces.
Figure 2D:
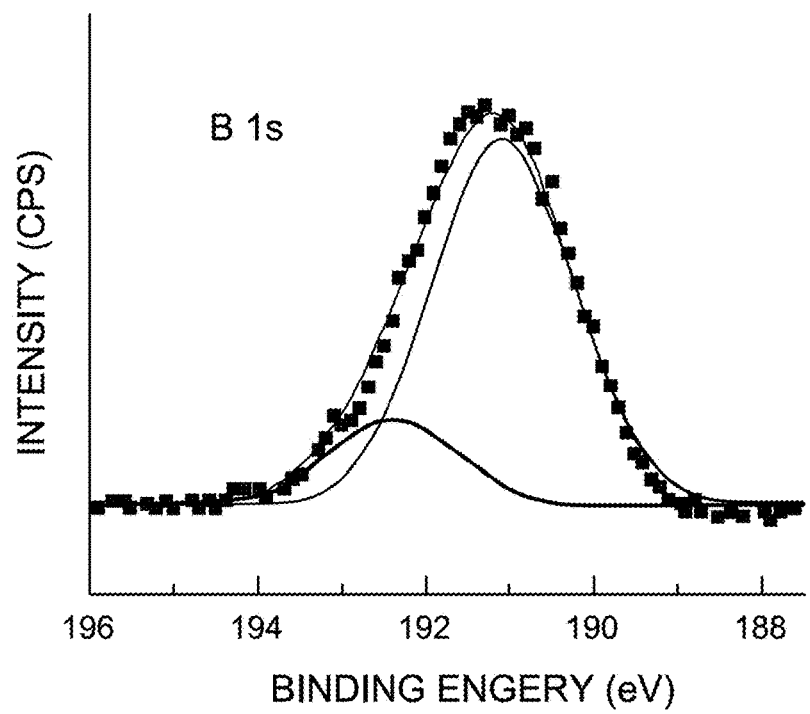
FIGS. 2D and 2E are XPS spectra of B is (FIG. 2D) and N is (FIG. 2E).
Figure 2E:
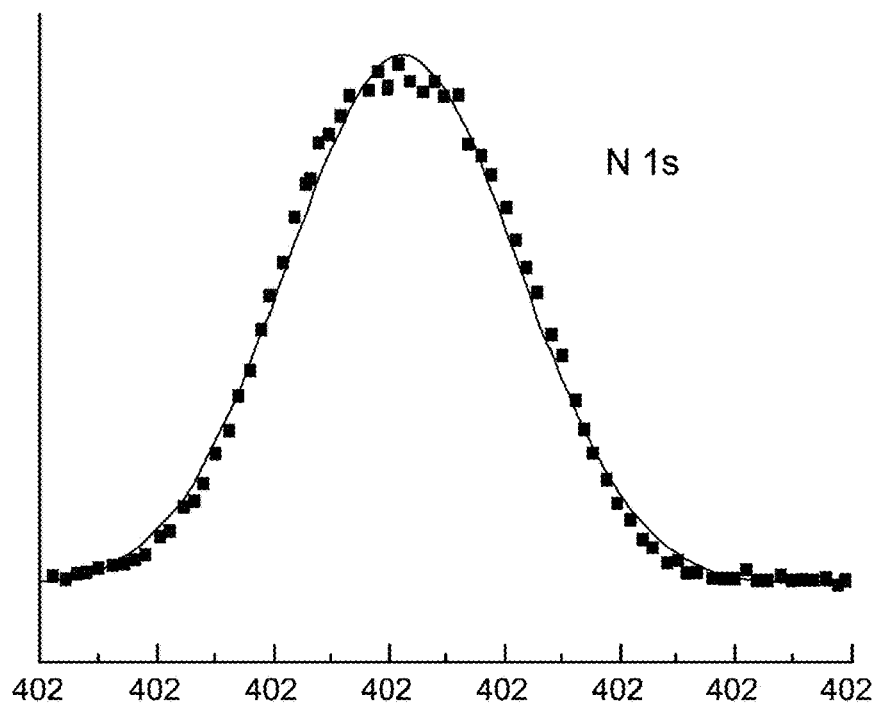
Figure 2F:
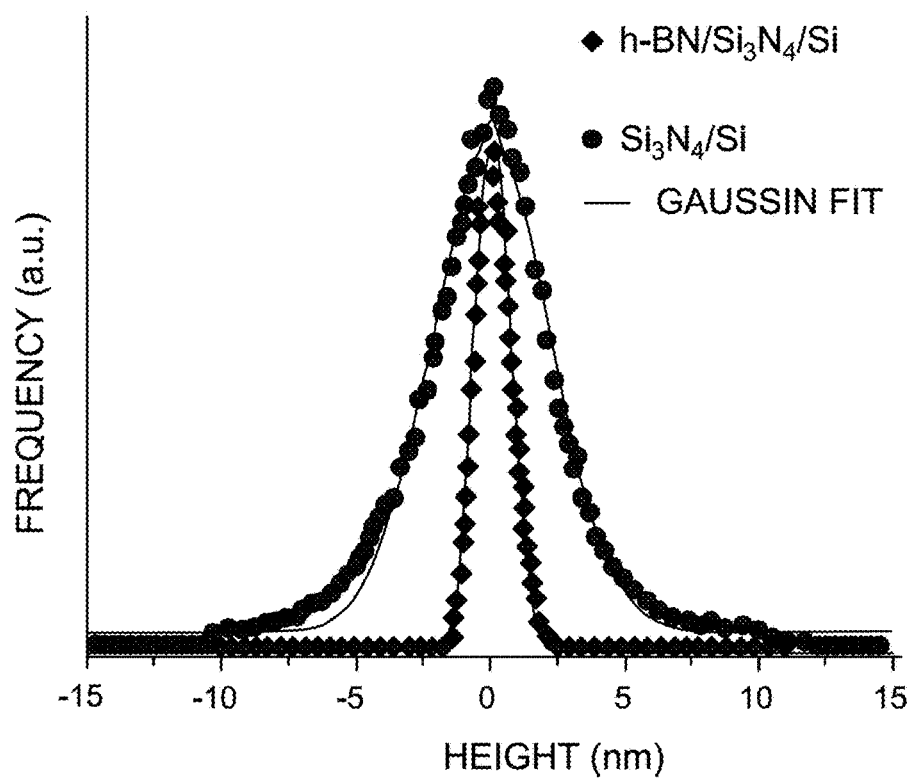
FIG. 2F is a surface roughness histogram of the height distribution measured via AFM for Si$_3$N$_4$/Si (square) and h-BN/Si$_3$N$_4$/Si (diamond) with Gaussian fit to the distribution presented in solid blue lines.

With reference to the Examples, in one embodiment, h-BN synthesis on $Si_3N_4$/Si was performed via low-pressure CVD (LPCVD) system. LPCVD is a preferred deposition technique since the growth is limited by surface reaction and the film formation is independent of the geometry of the substrate or gas flow effect. The quality and uniformity of h-BN film formed through nitride-assisted LPCVD on $Si_3N_4$/Si substrates may be confirmed by confocal Raman spectroscopy, which exhibit characteristic peaks at 1372 $cm^{-1}$ corresponding to $E_{2g}$ phonon vibration mode. See FIG. 2A, and the inset depicts the atomic vibrations. The h-BN film continuity and uniformity is an important criteria for further graphene electronics, which is clearly noticed in the optical microscopic (OM) image (See FIG. 2B) and Raman spatial mapping (see FIG. 2C), where the regions marked by circles correspond to consistent Raman spectra in FIG. 2A. The upper left circles in FIGS. 2B and 2C correspond to the bottom curve in FIG. 2A. The center circles in FIGS. 2B and 2C correspond to the upper curve in FIG. 2A. The bottom right circles in FIGS. 2B and 2C correspond to the middle curve in FIG. 2A. The homogeneous color contrast in both the OM image and Raman mapping clearly shows a continuous, and uniform h-BN film formation on $Si_3N_4$/Si substrates. In order to further confirm the formations of h-BN film on $Si_3N_4$/Si substrate, elemental composition and stoichiometry were analyzed via the X-ray photoelectron spectroscopy (XPS). FIGS. 2D and 2E present high resolution XPS spectra of boron (B) 1 s and nitrogen (N) 1 s, respectively, fitted by the Gaussian function. The B is spectrum consists of two peaks located at binding energy (BE) of 191.09 eV and 192.39 eV, which correspond to internal B—N bonding and B—N bonds at edge, respectively. The N is signal appears at BE of 398.87 eV and is attributed to B—N bonding. Further, the atomic concentration ratio of N and B is 1:1.11±0.09 indicating the formation of almost equal composition of B and N elements in h-BN. Further, h-BN surface is atomically smooth and therefore, it is important to examine the surfaces. FIG. 2F depicts the roughness histograms fitted by Gaussian distributions with standard deviations of 0.66 nm for the h-BN modified $Si_3N_4$/Si surface and 2.22 nm for the $Si_3N_4$/Si surface implying a 3.4 times increased surface smoothness for h-BN modified $Si_3N_4$/Si. This is lower than the 1.37 nm value for standard deviations for h-BN modified $SiO_2$ surface and 8.59 nm for the $SiO_2$ surface. See Behura, S., Nguyen, P., Che, S., Debbarma, R. & Berry, V. Large-Area, Transfer-Free, Oxide-Assisted Synthesis of Hexagonal Boron Nitride Films and Their Heterostructures with MoS2 and WS2. *Journal of the American Chemical Society* 137, 13060-13065, (2015).

Research on h-BN formations on metallic surfaces is shown the growth kinetics (surface-mediated for Cu and segregation-based for Ni and Fe). See Kim, S. M. et al. Synthesis of large-area multilayer hexagonal boron nitride for high material performance. *Nat Commun* 6, (2015). However, a clear understanding of h-BN growth mechanism is missing particularly on non-metallic surfaces such as: Si surface and Si-based dielectric surfaces ($Si_3N_4$/Si and $SiO_2$/Si). Herein an attempt has been made to understand the growth kinetics of h-BN film on $Si_3N_4$/Si and $SiO_2$/Si surfaces which is firmly supported by atomistic molecular dynamics (MD) simulations. The schematic for the h-BN growth mechanism on $Si_3N_4$/Si surfaces is presented in FIG. 3A. Nominally, the CVD growth of h-BN is processed via the following five elementary steps:

(1) The solid ammonia borane (AB) undergoes sublimation at about 100° C. and carried into reaction zone by hydrogen ($H_2$) gas flow (30 sccm).

(2) In the reaction zone below the growth temperature, the AB complex is thermally decomposed into $H_2$, aminoborane ($BH_2NH_2$) and borazine $(HBNH)_3$.

(3) At 120° C. to 300° C., the $(HBNH)_3$ and $(BH_2NH_2)$ molecules undergoes thermal-dehydrogenation and cross-linking reaction of B—H and N—H groups on the adjacent chain to form active species $(BN)_xH_y$. This active species $(BN)_xH_y$ is further dehydrogenated at 700° C.-1100° C. See Paffett, M. T., Simonson, R. J., Papin, P. & Paine, R. T. Borazine adsorption and decomposition at Pt(111) and Ru(001) surfaces. *Surface Science* 232, 286-296, (1990); and Fazen, P. J., Beck, J. S., Lynch, A. T., Remsen, E. E. & Sneddon, L. G. Thermally induced borazine dehydropolymerization reactions. Synthesis and ceramic conversion reactions of a new high-yield polymeric precursor to boron nitride. *Chemistry of Materials* 2, 96-97, (1990).

(4) These active species $(BN)_xH_y$ get adsorbed on the active sites of Si-based substrates.

(5) If the rate of attachment of active species on the active sites of the surface of Si-based substrates is higher than the rate of their detachments, then the active species $(BN)_xH_y$ stitch with other neighboring anchored $(BN)_xH_y$ species h-BN domains.

Figure 3A:
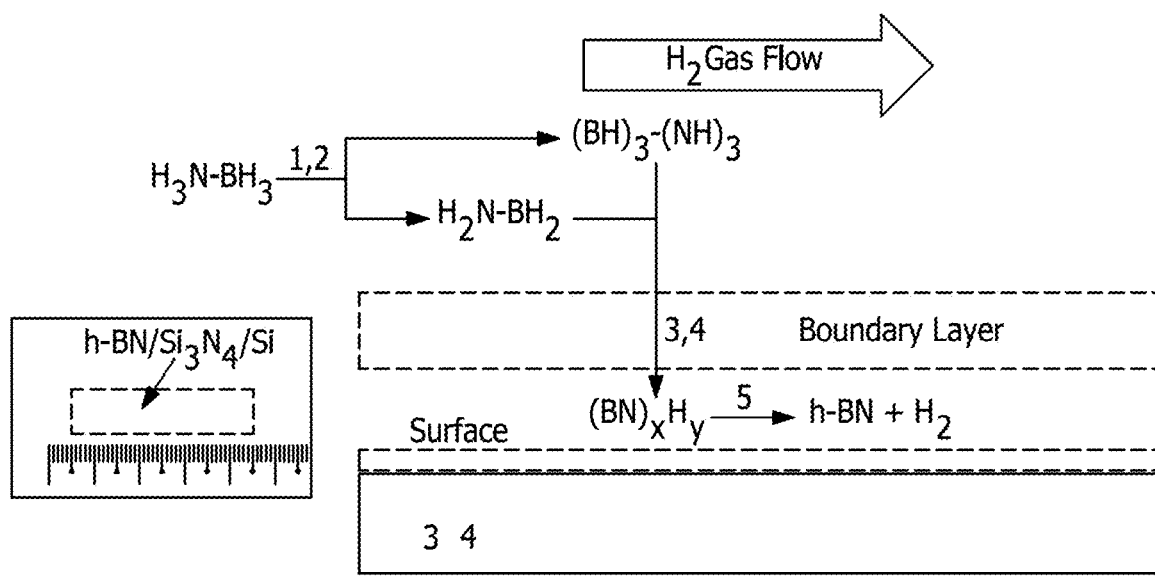
FIG. 3A is a schematic of h-BN growth process on Si$_3$N$_4$/Si surfaces with the inset shows the camera image of h-BN/Si$_3$N$_4$/Si of 1×5 cm$^2$ area.

Further, the left inset in FIG. 3A shows the camera image of h-BN on $Si_3N_4$/Si films of 1×5 cm² area coverage, reflecting the fact that large-area h-BN dielectric films are possible without any transfer-associated processes. The above important steps can be summarized as below:

(1, 2) Gas phase dissociations:

$NH_3$—$BH_3(g) \rightarrow NH_2$—$BH_2(g) + (NH)_3$—$(BH)_3(g) + H_2(g)$ (3) Active species $(BN)_xH_y$ formation:

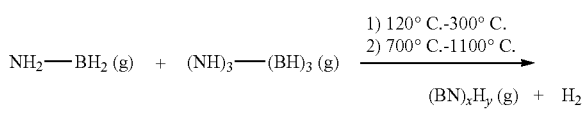

(4) Surface adsorption:

$(BN)_xH_y(g) + S \Leftrightarrow (BN)_xH_y$—$S$

S is the active sites of Si-based surfaces.

(5) Surface reaction: The rate at which these active species, $(BN)_xH_y$—S is reacted at the surface of Si-based substrate is provided by:

$(BN)_xH_y$—$S + (BN)_xH_y$—$S \Leftrightarrow h$-$BN + H_2$

During the CVD synthesis of h-BN at high temperature, the growth of h-BN is governed by the surface adsorption step ($k_a \ll k_s$) because (i) the surface reaction rate is taken place much faster due to its dependence on the Arrhenius term ($k_s \sim \exp(-E_A/RT)$), and (ii) the active species adsorbs lesser on the surface ($k_s \sim 1/\sqrt{T}$). Since these two steps are occurring in series, at steady state, the overall flux is defined as $$r_{process} = r_{adsorption} = r_{surface\ reaction} = \frac{dC_{hBN}}{dt} = k_A P_{BN} C_V.$$

Figure 3B:
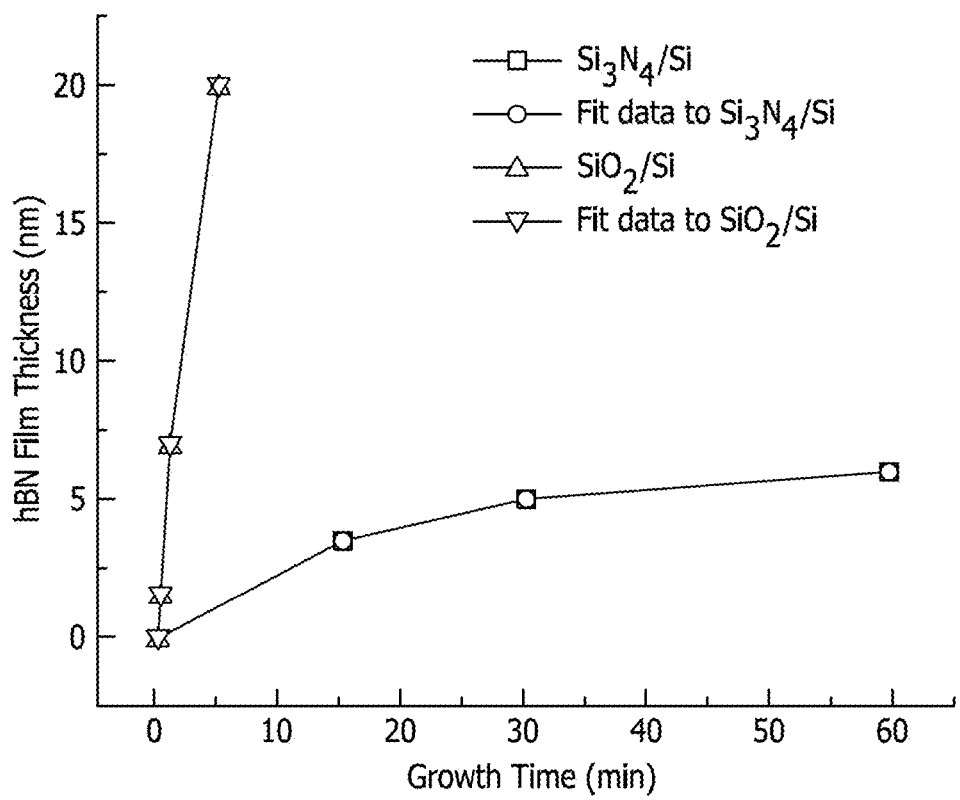
FIG. 3B depicts variations of h-BN film thickness with CVD growth time on Si-based oxide and nitride substrates.

The solution of this differential equation is:

$$T_{hBN} = T_S\left(1 - e^{-\frac{t}{\tau}}\right) \quad (1)$$

Where $T_{hBN}$ is the thickness of h-BN film, $T_S$ is the characteristic thickness of h-BN film (i.e. the maximal thickness of h-BN film), t is growth time, and τ is the characteristic time of adsorption. The data is well fit (solid line in FIG. 3B) with the derived equation (1), in which the characteristic thicknesses of h-BN on $Si_3N_4$/Si and $SiO_2$/Si at given growth conditions are 5, and 20 nm, respectively. This characteristic thickness, $T_S$ depends on the density of active sites ($SiO_2$/Si surface possess 4 times higher active sites than $Si_3N_4$/Si surface. Further, the characteristic time indicates the adsorption of the active species as the $(BN)_xH_y$ prefers the $SiO_2$/Si surface to the $Si_3N_4$/Si surface.

Figure 3C:
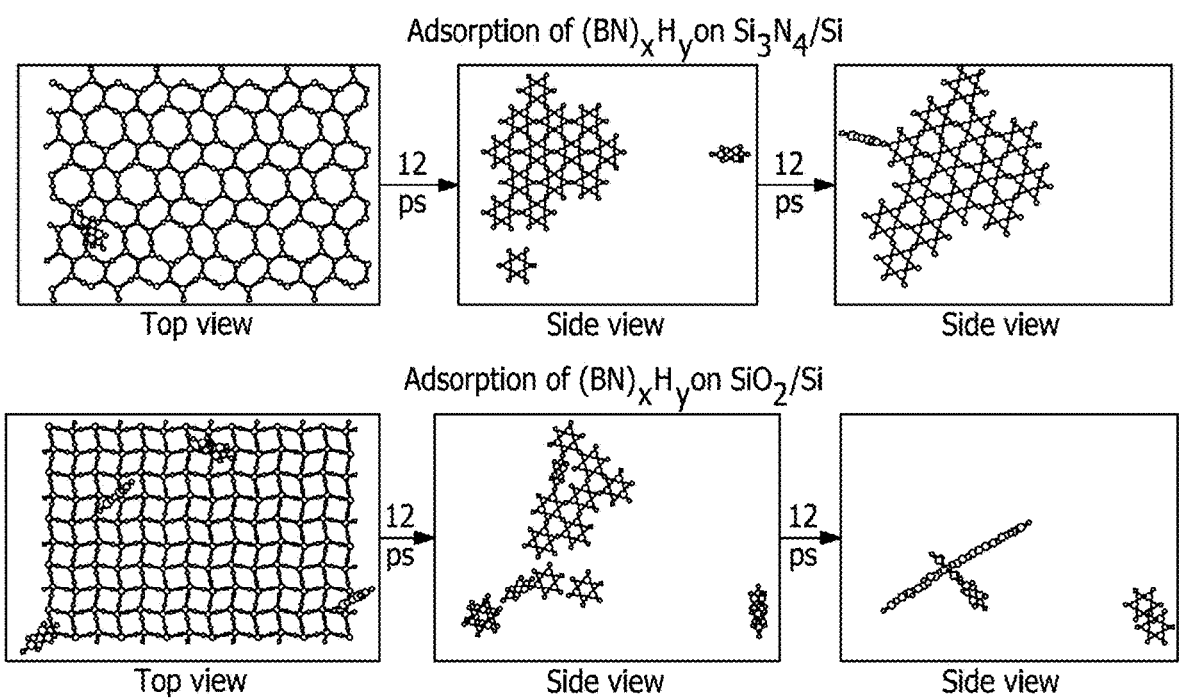
FIG. 3C is an atomistic MD simulation showing the adsorption of (BN)$_x$H$_y$ active species on Si$_3$N$_4$/Si and SiO$_2$/Si surfaces.

The model derived for the growth kinetics of h-BN films on $SiO_2$/Si and $Si_3N_4$/Si surfaces is based on the assumption that the thickness of the film on the substrates depend on the adsorption of the reactants from the gas phase to the substrate. The model also assumes that the evolution of hydrogen and the formation of hexagonal boron nitride is the last step in the growth process. To understand the effect of the substrate on the adsorption of the reactants, we performed atomistic molecular dynamics simulations using the open source LAMMPS package. See Plimpton, S. Fast Parallel Algorithms for Short-Range Molecular Dynamics. *Journal of Computational Physics* 117, 1-19, (1995). To model the adsorption of the borazine molecules on the surface, we used all-atom interaction potentials. The van-der Waals interaction is modelled using the 6-12 Lennard jones potential and the electrostatic potential is modelled using Coulomb's law. The adsorption of borazine molecules on $SiO_2$/Si and $Si_3N_4$/Si surfaces were studied using NVT ensemble simulations at a temperature of 1000 K. In the entire simulation only the borazine molecules were kept mobile and further the molecules were treated as rigid bodies and the force on each molecule is the sum of forces on all the 12 atoms in the molecule ($B_3N_3H_6$). The simulations were performed using a time step of 0.25 femtoseconds for a total time of 500 picoseconds. Initially the borazine molecules will be attracted towards the substrate by the long range electrostatic forces and once they are at the substrate, the short range van der Waals and Coulombic forces will keep them adsorbed at the substrate. Because of the polar nature of the borazine molecules, we observed that initially in the gas phase they tend to form planar 2D clusters. A few molecules that don't form clusters in the gas phase get adsorbed over the substrates. We observed that after 12 ps there were four borazine molecules adsorbed over $SiO_2$/Si whereas only one borazine molecule was adsorbed over $Si_3N_4$/Si surface. The higher adsorption over $SiO_2$/Si compared to $Si_3N_4$/Si can be explained by the surface charge of the top layer of the substrates even though both the substrates maintain overall charge neutrality. The (0 0 1) plane (top layer) of $SiO_2$/Si just consists of dangling oxygen atoms and the silicon atoms are 1.24 Å below the surface oxygen atoms. See FIG. 3C. So the top layer of the $SiO_2$/Si substrate is negatively charged. Whereas the (0 0 1) plane (top layer) of the $Si_3N_4$/Si substrate has planar arrangement of both Si and N atoms and the overall charge of the top layer is zero. See FIG. 3C. The negatively charged dangling oxygen atoms in $SiO_2$/Si tend to adsorb more borazine molecules compared to the planar and neutral surface of $Si_3N_4$/Si. The planar clusters that form in the gas phase eventually adsorb over the substrates. We observed that for both the substrates, the clusters attach to the already adsorbed borazine molecules. Since the $SiO_2$/Si substrate adsorbs more borazine molecules, the clusters have more sites to attach onto the $SiO_2$/Si substrate compared to the $Si_3N_4$/Si substrate. It was also observed that the time required for the adsorption of all the borazine molecules from the gas phase to the substrate was approximately 75 ps and 200 ps for $SiO_2$/Si and $Si_3N_4$/Si, respectively. The adsorbed clusters will cover the surface and eventually undergoes dehydrogenation and form h-BN as predicted by the proposed growth model.

Figure 3D:
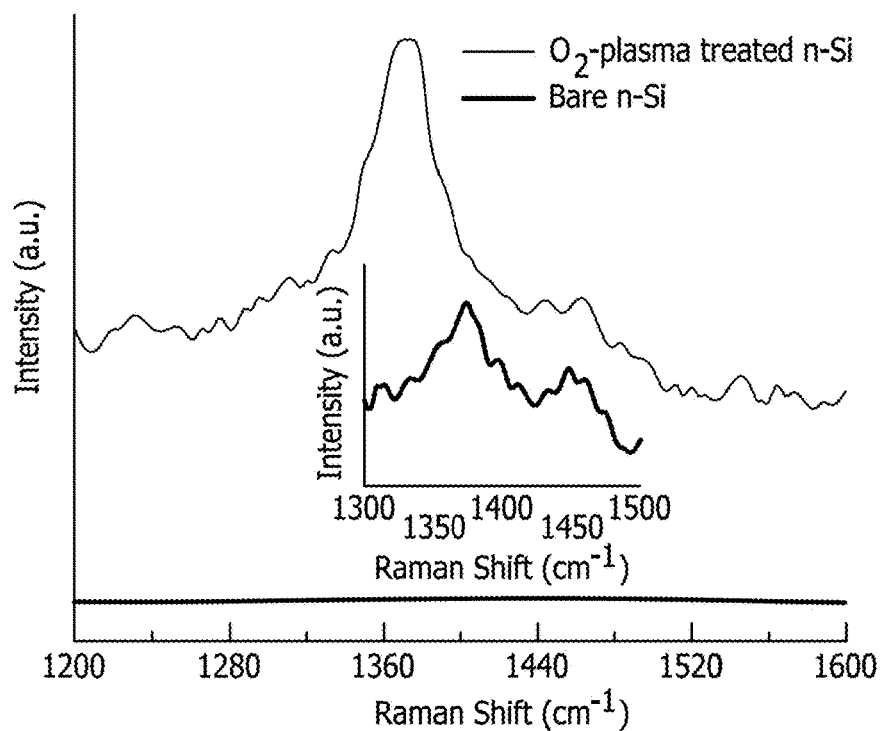
FIG. 3D is a Raman spectra of h-BN formations on bare Si and O$_2$-plasma treated Si.
Figure 3E:
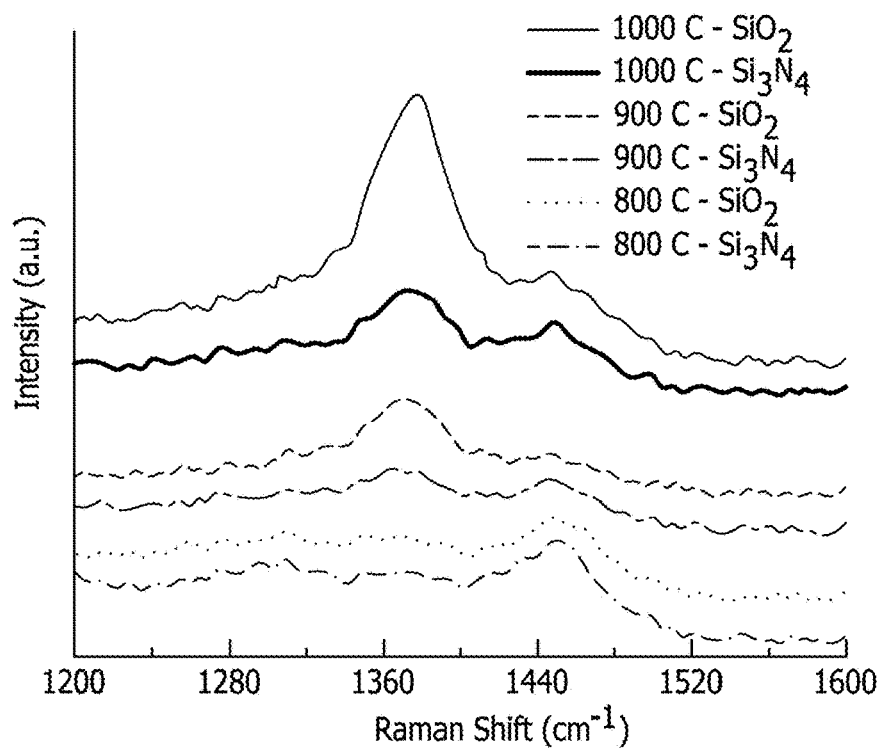
FIG. 3E is a Raman spectra of h-BN formations on Si-based oxide and nitride substrates at different temperatures.

The experimental verification with proposed growth model and subsequent MD simulations suggest that surface adsorption is the rate limiting step for h-BN nucleation on Si-based dielectric surfaces. In order to further confirm the adsorption kinetics guided mechanism, an innovative experimental setup was designed to grow h-BN on bare Si and $O_2$-plasma treated Si maintaining same CVD conditions. As expected the h-BN growth rate is higher in $O_2$-plasma treated Si surface in contrast to bare Si surface as evidenced by increase in Raman intensity for $E_{2g}$ peak of h-BN (FIG. 3D), since high Raman intensity imply thicker films. See Gorbachev, R. V. et al. Hunting for Monolayer Boron Nitride: Optical and Raman Signatures. *Small* 7, 465-468, (2011). Therefore, it is clear that the process is adsorption kinetics assisted as the $O_2$-plasma treated Si surface exhibits more number of active sites ($C_S$) compared to bare Si surface. Further, the effect of growth temperature on h-BN formations on $SiO_2$/Si and $Si_3N_4$/Si surfaces was examined via Raman spectroscopy and presented in FIG. 3E. While the metal catalyst surfaces nucleate h-BN films at temperatures of 750° C., the h-BN formations on $SiO_2$/Si and $Si_3N_4$/Si surfaces occur at about 900° C. See Wang, L. et al. Monolayer Hexagonal Boron Nitride Films with Large Domain Size and Clean Interface for Enhancing the Mobility of Graphene-Based Field-Effect Transistors. *Advanced Materials* 26, 1559-1564, (2014). This is consistent with an earlier report on direct nanocrystalline h-BN formations on $SiO_2$/Si substrates. However, no h-BN growth or mechanism is reported on $Si_3N_4$/Si surfaces, while there is a report on powdered $Si_3N_4$/hBN composite. See Kusunose, T., Sekino, T., Choa, Y. H. & Niihara, K. Fabrication and Microstructure of Silicon Nitride/Boron Nitride Nanocomposites. *Journal of the American Ceramic Society* 85, 2678-2688, (2002). FIG. 3E shows that the h-BN formation does not occur below 800° C. Since high Raman intensity imply thicker h-BN, the $Si_3N_4$/Si surface allows less adsorption of $(BN)_xH_y$-radicals, forming thinner h-BN films in comparison to $SiO_2$/Si surfaces. A small peak at about 1450 cm$^{-1}$ in FIG. 3E demonstrates the third order transverse optical phonon mode for silicon as underlying substrate is $Si_3N_4$/Si. See Spizzirri, P. G., J.-H. F., S. R., E. G. & Prawer, a. S. Nano-Raman spectroscopy of silicon surfaces, (2010). Further, the mechanism behind the difference in h-BN growth kinetics on $SiO_2$/Si and $Si_3N_4$/Si surfaces can be understood by detailed surface analysis. Further, a recent report describes that $Si_3N_4$/Si surface is more hydrophobic than $SiO_2$/Si surface which clearly indicate that the $SiO_2$/Si surface favors the h-BN formations and nucleate thicker, though rougher films in contrast to thinner and smoother films on $Si_3N_4$/Si surfaces. See Agarwal, D. K., Maheshwari, N., Mukherji, S. & Rao, V. R. Asymmetric immobilization of antibodies on a piezo-resistive micro-cantilever surface. *RSC Advances* 6, 17606-17616, (2016).

Figure 4A:
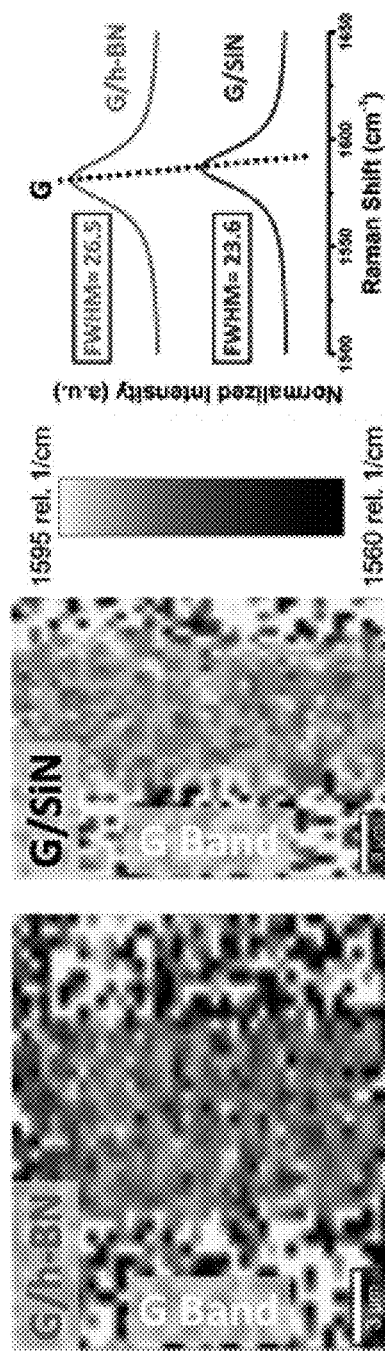
FIG. 4A is a Raman G-band spectrum for graphene/h-BN and graphene/Si$_3$N$_4$ heterostructure with the spatial mapping.
Figure 4B:
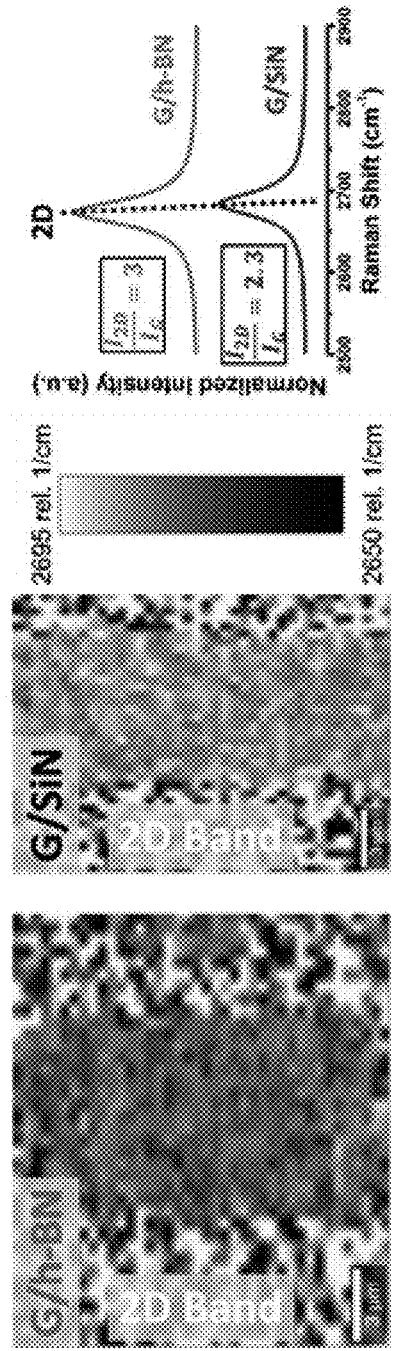
FIG. 4B is a Raman 2D-band spectrum for graphene/h-BN and graphene/Si$_3$N$_4$ heterostructure with the spatial mapping.

To test the direct h-BN's potential for nanoelectronics, monolayer graphene (MLG) was grown and transferred onto h-BN/$Si_3N_4$/Si and $Si_3N_4$/Si substrates. In order to comprehend the charge-impurity effect of h-BN and $Si_3N_4$/Si substrates on graphene film, we analyze the doping dependent parameters of G-band position, full-width at half maxima of G-band (FWHM (G)), 2D-band position, and the ratio of the intensities of the 2D and G bands ($I_{2D}/I_G$) via confocal Raman spectroscopy. See DasA et al. Monitoring dopants by Raman scattering in an electrochemically top-gated graphene transistor. *Nat Nano* 3, 210-215, (2008). In FIG. 4A, the G peak of graphene on h-BN (denote as G/h-BN) and graphene on $Si_3N_4$/Si (denote as G/SiN) are dominantly centered at 1581.5 cm$^{-1}$, and 1586.8 cm$^{-1}$, respectively. The calculated FWHM of the G band is decreased from 26.5 cm$^{-1}$ (h-BN substrate) to 23.6 cm$^{-1}$ ($Si_3N_4$/Si substrate). Further, in FIG. 4B, the 2D band for G/h-BN and G/SiN is presented at 2673.3 cm$^{-1}$, and 2683.4 cm$^{-1}$, respectively. In addition, the ratio, $I_{2D}/I_G$ is found to be increased from 2.3 for G/SiN to 3 for G/h-BN. The observation of the softening of the G and 2D bands, the sharpening of the G peak FWHM in addition to the high $I_{2D}/I_G$ clearly signify a low charged impurity of graphene on hBN substrate compared to the graphene on $Si_3N_4$/Si counterpart. In our device configurations, such charge impurities may originate from: (i) photoresist residue (while fabricating transistor devices as discussed later), and (ii) electron hole puddling (bottom h-BN substrate). Since the processes of device fabrications on hBN and $Si_3N_4$/Si substrates are similar and same graphene film was used, it is obvious that the charge-donating impurities (n*) from underlying substrates play a critical role in our measurements. See Xue, J. et al. Scanning tunnelling microscopy and spectroscopy of ultra-flat graphene on hexagonal boron nitride. *Nat Mater* 10, 282-285, (2011); and Zhang, Y., Brar, V. W., Girit, C., Zettl, A. & Crommie, M. F. Origin of spatial charge inhomogeneity in graphene. *Nat Phys* 5, 722-726, (2009). The Raman spectra of G and 2D peaks were averaged over the whole area of graphene devices and fitted with Lorentzian curves.

Figure 5A:
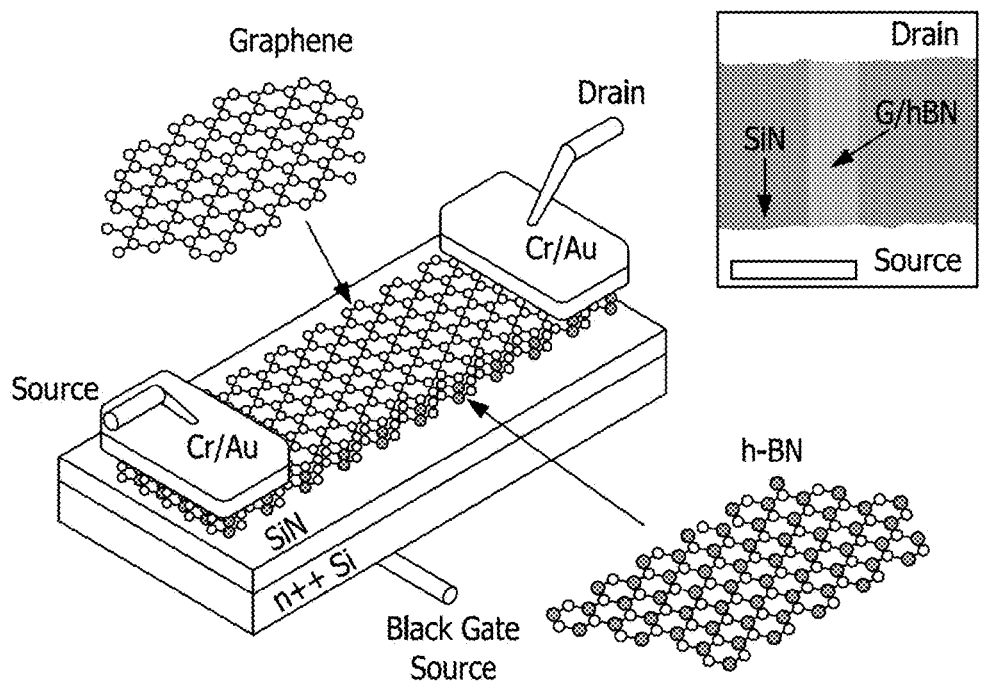
FIGS. 5A through 5E depict electrical transport properties.
Figure 5B:
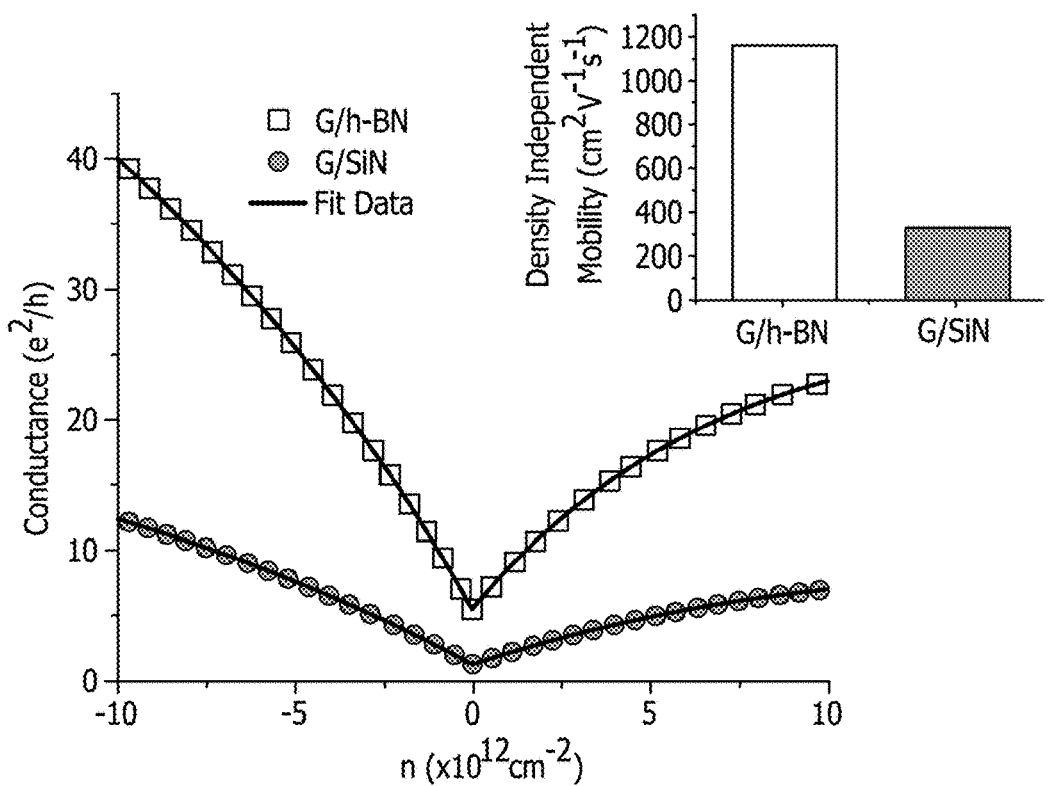
Figure 5C:
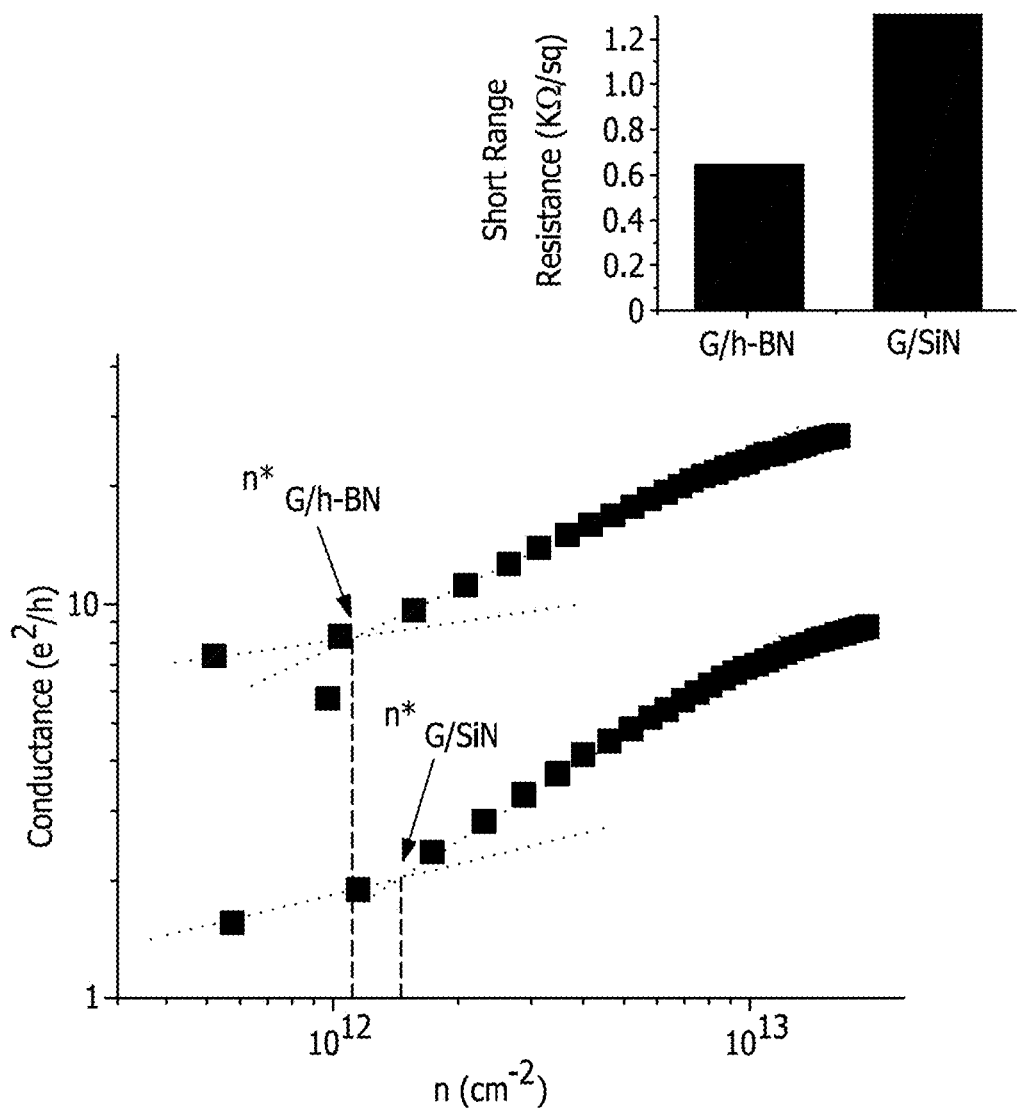

The charge inhomogeneity not only affect the as-discussed Raman scattering parameters, but also is the dominant cause of scattering for electrons in G/h-BN, and G/SiN heterostructure devices. A typical schematic of G/h-BN back-gate field effect transistor is shown in FIG. 5A with an optical image of device geometry (27 μm×7.5 μm) with Cr/Au (15/95 nm) as the source and drain contact in the inset. Being characterized with a lower charge fluctuations, our direct grown h-BN substrate platform promises to provide a competitive advantage in the enhancement of the charge carrier mobility in graphene devices comparing to high k dielectric substrate ($Si_3N_4$/Si in our study). It is important to note that both the devices designed with the same contact material (Cr/Au) and also similar device treatments, therefore, we can speculate the same effect of contact resistances on the electrical performances for both the devices. In FIG. 5B, it is clearly noticed that the conductance is strongly sublinear in carrier density, which indicates a crossover from low carrier densities where scattering is dominated by charge impurities to large carrier densities where short-range impurity scattering is nominally taken place. See Nomura, K. & MacDonald, A. H. Quantum Transport of Massless Dirac Fermions. *Physical Review Letters* 98, 076602 (2007). The data obtained (FIG. 5B) can be fitted with a self-consistent Boltzmann equation for diffusive transport which includes both long- and short-range scattering:

$$(\sigma)^{-1} = (ne\mu_C + \sigma_{res})^{-1} + \rho_S \quad (2)$$

where $\mu_C$ is density-independent mobility due to charged-impurity Coulomb (long-range) scattering, $\rho_S$ is the contribution to resistivity from short-range scattering, and $\sigma_{res}$ is the residual conductivity at the charge neutrality point. See Hwang, E. H., Adam, S. & Sarma, S. D. Carrier Transport in Two-Dimensional Graphene Layers. *Physical Review Letters* 98, 186806 (2007). As shown in the inset of FIG. 5B, the calculated mobility, $\mu_C$ is 1200 cm$^2$ V$^{-1}$ s$^{-1}$ for G/h-BN device (3.5 times higher than G/SiN). The enhancement in mobility for G/h-BN system can be elucidated by two following dominant mechanisms: (i) Columbic scattering near the charge neutrality point, and (ii) electron-phonon scattering at high carrier density. In the first mechanism (Coulombic scattering), the minimum conductivity of G/h-BN device ($\sigma_{min}$=7 e$^2$/h) is 3.5 times higher than G/SiN device ($\sigma_{min}$=2 e$^2$/h), implying that the charged impurities located in the h-BN substrate is about 12 times lower than they are in the $Si_3N_4$/Si substrate. Further, the charge inhomogeneity point (n*) is the inflection point at which the Coulombic scattering becomes dominant, and vice versa. At low charge inhomogeneity, the conductance peak of G/h-BN is narrower than one of G/SiN attributed to electron-hole puddle formation at low carrier density. Consequently, the corresponding concentration can be estimated by plotting the low temperature conductivity (σ) against the carrier density (n) in a logarithmic scale as shown in FIG. 5C. See Couto, N. J. G. et al. Random Strain Fluctuations as Dominant Disorder Source for High-Quality On-Substrate Graphene Devices. *Physical Review X* 4, 041019 (2014); and Banszerus, L. et al. Ultrahigh-mobility graphene devices from chemical vapor deposition on reusable copper. *Science Advances* 1, (2015). In our hetero-structure devices, the extracted n* of $1.1\times10^{12}$ cm$^{-2}$, and $1.6\times10^{12}$ cm$^{-2}$ for G/h-BN and G/SiN, respectively indicate a more homogeneous potential background in h-BN substrate than in Si$_3$N$_4$/Si substrate counterpart. These observations are in good agreement with the result in our Raman spectroscopy data and also in some previous studies. See Hwang, E. H., Adam, S. & Sarma, S. D. Carrier Transport in Two-Dimensional Graphene Layers. *Physical Review Letters* 98, 186806 (2007). Another contribution in enhancement of mobility in our G/hBN device is due to the electron-phonon scattering, which is speculated to comprise a significant contribution in our samples. See Katsnelson, M. I. & Geim, A. K. Electron scattering on microscopic corrugations in graphene. *Philosophical Transactions of the Royal Society of London A: Mathematical, Physical and Engineering Sciences* 366, 195-204, (2008).

In the inset of FIG. 4C, the short range resistivity ($\rho_S$) are calculated to be 600 $\Omega$/sq and 1800 $\Omega$/sq for G/h-BN and G/SiN, respectively. Even though, the origins of short range resistivity is still a subject of debate, in our samples it is expected to be attributed to the factors such as: (i) lattice defect or point defect of graphene film, (ii) the flexural (out of plane) phonons that are excited inside the ripples of graphene, and (iii) surface polar optical phonon of underlying substrates. See Morozov, S. V. et al. Giant Intrinsic Carrier Mobilities in Graphene and Its Bilayer. *Physical Review Letters* 100, 016602 (2008); Ishigami, M., Chen, J. H., Cullen, W. G., Fuhrer, M. S. & Williams, E. D. Atomic Structure of Graphene on SiO2. *Nano Letters* 7, 1643-1648, (2007); and Hwang, E. H. & Das Sarma, S. Acoustic phonon scattering limited carrier mobility in two-dimensional extrinsic graphene. *Physical Review B* 77, 115449 (2008). The first factor is speculated to have negligible effect since our Raman data indicates high quality transferred graphene on h-BN and Si$_3$N$_4$. On the other hand, as shown in FIG. 2C, the smooth h-BN substrate implies lower density of graphene ripples in G/SiN device, hence h-BN suppresses the activated flexural phonon-graphene electron scattering. See Hwang, E. H. & Das Sarma, S. Acoustic phonon scattering limited carrier mobility in two-dimensional extrinsic graphene. *Physical Review B* 77, 115449 (2008); and Lui, C. H., Liu, L., Mak, K. F., Flynn, G. W. & Heinz, T. F. Ultraflat graphene. *Nature* 462, 339-341, (2009). Moreover, the surface optical phonon modes of h-BN have energy two times larger than similar modes in Si$_3$N$_4$/Si, suggesting lesser phonon scattering in graphene channel. It is noted that in the present samples, despite the cleaner substrate, the Dirac point for G/h-BN heterostructure has similar value (~9 V) as the Dirac point for G/SiN device which requires further understanding of this phenomena.

Figure 5D:
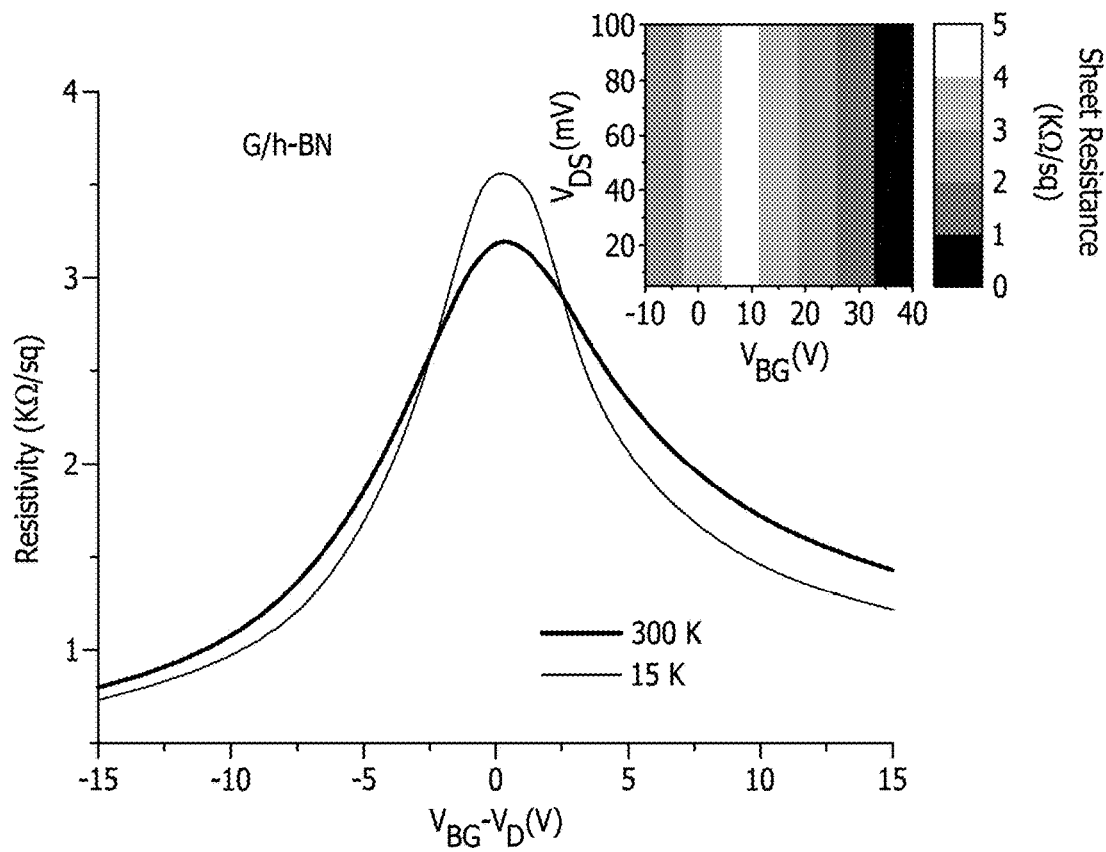

The temperature dependence of the G/h-BN device's sheet resistivity on applied back-gate voltage ($V_{BG}$-$V_D$) at low (T=15 K, red curve), and at room temperature (T=300 K, black curve) are shown in FIG. 5D. See Zhang, Y., Mendez, E. E. & Du, X. Mobility-Dependent Low-Frequency Noise in Graphene Field-Effect Transistors. *ACS Nano* 5, 8124-8130, (2011). As temperature increases, at low density regime, n<|n*|, the G/h-BN device exhibits non-metallic behavior $$\left(\frac{d\rho}{dt}<0\right),$$

while at high density regime, n>|n*|, the device is pronouncedly metallic $$\left(\frac{d\rho}{dt}>0\right).$$

See Heo, J. et al. Nonmonotonic temperature dependent transport in graphene grown by chemical vapor deposition. *Physical Review B* 84, 035421 (2011); and Bolotin, K. I., Sikes, K. J., Hone, J., Stormer, H. L. & Kim, P. Temperature-Dependent Transport in Suspended Graphene. *Physical Review Letters* 101, 096802 (2008).

The increase of sheet resistance of graphene at high density regime is due to longitudinal acoustic phonon scattering:

$$\rho_{LA}(T)=(h/e^2)[(\pi^2 D_A^2 k_B T)/(2h^2\rho_S v_S^2 v_f^2)] \quad (3)$$

where $\rho_S$ is graphene mass density ($7.6\times10^{-7}$ kg·m$^{-2}$), $v_f$ is Fermi velocity ($1\times10^6$ m s$^{-1}$), $v_S$ is the longitudinal acoustic phonon velocity ($2\times10^4$ m s$^{-1}$), and $D_A$ is the acoustic deformation potential. The linear fits to the electron and hole side provides $D_A$ to be 39 eV and 19 eV, respectively. The findings are in good agreement with previous investigations. See Bolotin, K. I., Sikes, K. J., Hone, J., Stormer, H. L. & Kim, P. Temperature-Dependent Transport in Suspended Graphene. *Physical Review Letters* 101, 096802 (2008); Chen, J.-H., Jang, C., Xiao, S., Ishigami, M. & Fuhrer, M. S. Intrinsic and extrinsic performance limits of graphene devices on SiO2. *Nat Nano* 3, 206-209, (2008); and Yigen, S., Tayari, V., Island, J. O., Porter, J. M. & Champagne, A. R. Electronic thermal conductivity measurements in intrinsic graphene. *Physical Review B* 87, 241411 (2013).

In addition the inset shows G/h-BN conductance as a function of ($V_{BG}$, and $V_{DS}$). The $I_{on}/I_{off}$ ratio for G/h-BN device is ~5.5, making our h-BN substrate applicable for large-scale graphene and other 2DNs electronics. It is well-known from the literature that the field effect mobility is defined as the derivative of the Drude formula, $$\mu_{FE}=\left(\frac{1}{C}\right)\left(\frac{d\sigma}{dV_{BG}}\right).$$

Figure 5E:
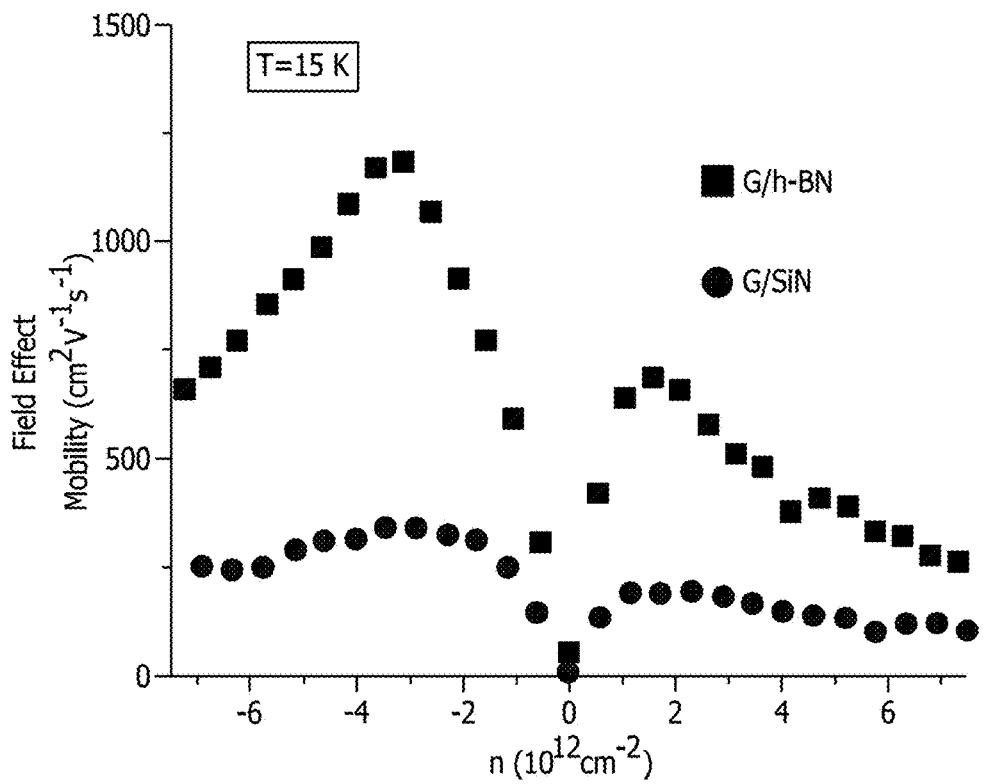

In case of G/h-BN (G/SiN) device, the $\mu_{FE}$ varies from 500 cm$^2$V$^{-1}$ s$^{-1}$ (250 cm$^2$V$^{-1}$ s$^{-1}$) at high densities to 1300 cm$^2$ V$^{-1}$ s$^{-1}$ (350 cm$^2$ V$^{-1}$ s$^{-1}$) near charge neutrality point. This further confirms the enhancement of graphene's mobility on h-BN substrate in comparison to Si$_3$N$_4$/Si substrate over entire density regime as shown in FIG. 5E.

III. Deposition of Catalytic Metal Layer

Figure 1D:
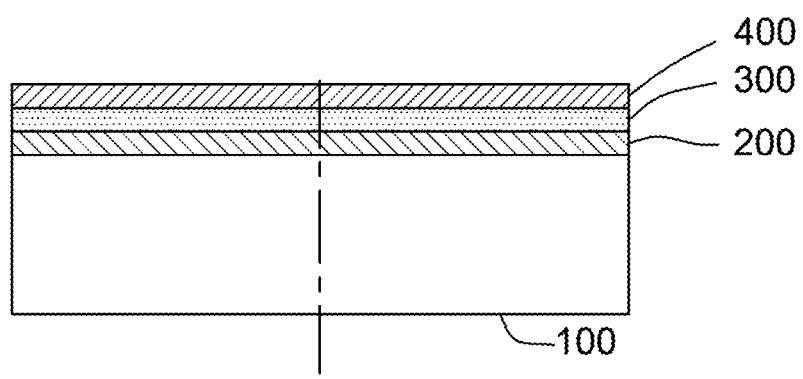

With reference to FIG. 1D, according to the method of the present invention, after direct deposition of layer 300 comprising hexagonal boron nitride on the front surface of the single crystal semiconductor substrate or on the front surface of the dielectric layer 200, the substrate 100 comprising the layer 300 comprising hexagonal boron nitride and the, optional, dielectric layer 200 may be treated to deposit a catalytic metal layer 400 for subsequent growth of graphene on the multilayer structure. In some embodiments, the catalytic metal layer 400 may be deposited over the entire layer 300 comprising hexagonal boron nitride. In some embodiments, the catalytic metal layer 400 may be deposited over a portion of the layer 300 comprising hexagonal boron nitride, such as at least about 10% of the total area of the major surface, or at least about 25% of the total area, or at least about 50% of the total area, or at least about 75% of the total area. In some embodiments, the catalytic metal layer 400 may be deposited over the entire layer 300 comprising hexagonal boron nitride and thereafter metal may be removed selectively, using conventional lithography techniques, to thereby leave a desired pattern of metal deposition on the major surface of the substrate. Herein, the surfaces of the catalytic metal layer 400 may be referred to as a "front metal layer surface" and "a back metal layer surface." Herein, the back metal layer surface is in contact with the layer 300 comprising hexagonal boron nitride. A bulk metal region is between the front and back metal film surfaces.

Metals suitable for the present invention include nickel, copper, iron, platinum, palladium, ruthenium, cobalt, aluminum, and alloys thereof. In some preferred embodiments, the catalytic metal layer 400 comprises nickel. In some preferred embodiments, the catalytic metal layer 400 comprises cobalt. In some preferred embodiments, the catalytic metal layer 400 comprises nickel and cobalt, e.g., an alloy of nickel and cobalt. In some preferred embodiments, the catalytic metal layer 400 comprises copper. The catalytic metal layer 400 may be deposited by techniques known in the art, including sputtering, thermal evaporation, ion beam evaporation, chemical vapor deposition, electrolytic plating, and metal foil bonding. In some embodiments, the catalytic metal layer 400 is deposited by sputtering or evaporation using, e.g., a Sputtering and Metal evaporation Unit. Electrolytic metal plating may occur according to the methods described by Supriya, L.; Claus, R. O. Solution-Based Assembly of Conductive Gold Film on Flexible Polymer Substrates: Langmuir 2004, 20, 8870-8876. In some embodiments, the catalytic metal layer 400 may be deposited by chemical vapor deposition at relatively low temperatures, such as between about 100° C. and about 300° C., such as about 200° C. Preferably, the metal film is between about 50 nanometers and about 20 micrometers thick, such as between about 50 nanometers and about 10 micrometers thick, such as between about 50 nanometers and about 1000 nanometers, such as between about 100 nanometers and about 500 nanometers, such as between about 100 nanometers and about 400 nanometers, such as about 300 nanometers or about 500 nanometers.

In some embodiments, the catalytic metal layer 400 may comprise metal that has relatively high solubility for carbon at elevated temperatures (i.e., generally greater than 500° C., or greater than 800° C., such as about 1000° C.), which enables in-diffusion of carbon during the graphene layer step. High solubility metal films at the temperature of in-diffusion include nickel, iron, palladium, and cobalt. In some embodiments, the catalytic metal layer 400 comprises metal having carbon solubility of at least about 0.05 atomic % at 1000° C., preferably at least about 0.10 atomic % at 1000° C., ever more preferably at least about 0.15 atomic % at 1000° C. In some embodiments, the catalytic metal layer 400 comprises metal having carbon solubility less than about 3 atomic % at 1000° C., preferably less than about 2 atomic % at 1000° C. For example, in some preferred embodiments, the catalytic metal layer 400 comprises nickel, which has a carbon solubility of about 0.2 atomic % at 1000° C., which is the chamber temperature for carbon in-diffusion when nickel is the metal film. In some embodiments, the catalytic metal layer 400 comprises iron, which has a carbon solubility of about 0.02 atomic % at 800° C., which is the chamber temperature for carbon in-diffusion when iron is the metal film. In some embodiments, the catalytic metal layer 400 comprises cobalt, which has a carbon solubility of about 1.6 atomic % at 1000° C., which is the chamber temperature for carbon in-diffusion when cobalt is the metal film.

In some embodiments, the catalytic metal layer 400 may comprise metal that has low or substantially zero solubility or boron, nitrogen, and carbon even at elevated temperatures (i.e., generally greater than 500° C., or greater than 800° C., such as about 1000° C.). Low solubility metal films include copper, platinum, and ruthenium. For example, carbon solubility is virtually zero in copper at temperatures greater than 500° C., or greater than 800° C., such as about 1000° C. During the in-diffusion step, the gaseous atoms, e.g., carbon, in-diffuse into the bulk metal region between metal grains, e.g., copper grains. When copper is selected as the metal for the catalytic metal layer 400, the carbon containing gas or the carbon containing polymer is degraded by hydrogen on copper. Carbon-carbon bond formation into graphene is catalyzed by on the copper surface.

After deposition of the catalytic metal layer 400, the multilayer structure may be cleaned. The multilayer structure comprises the single crystal semiconductor wafer substrate 100, the dielectric layer 200, the layer 300 comprising hexagonal boron nitride, and the catalytic metal layer 400. In some preferred embodiments, the multilayer structure may be cleaned by heating the structure in a vacuum furnace in a reducing atmosphere. A chemical vapor deposition system may be used where only baking under high vacuum is performed. In preferred embodiments, the reducing atmosphere comprises hydrogen gas or other reducing gas. An inert carrier gas may be used, such as argon or helium. In preferred embodiments, the temperature during exposure to the reducing atmosphere is preferably between about 800° C. and about 1200° C., such as about 1000° C. The pressure is preferably sub-atmospheric, such as less than about 100 Pa (less than 1 Torr), preferably less than about 1 Pa (less than 0.01 Torr), even more preferably less than about 0.1 Pa (less than 0.001 Torr), and even more preferably less than about 0.01 Pa (less than 0.0001 Torr). The cleaning anneal may adjust the grain size of the metal film, e.g., increase the grain size at elevated temperatures.

IV. Deposition of Graphene Layer

According to some embodiments of the method of the present invention, after deposition of the catalytic metal layer 400, the multilayer structure is treated to deposit a layer of graphene.

In some embodiments, the structure may be cleaned in a reducing atmosphere. In some preferred embodiments, the multilayer structure may be cleaned by heating the structure in a vacuum furnace in a reducing atmosphere. A chemical vapor deposition system may be used where only baking under high vacuum is performed. In preferred embodiments, the reducing atmosphere comprises hydrogen gas or other reducing gas. An inert carrier gas may be used, such as argon or helium. The atmosphere is preferably a reducing atmosphere, which may comprise between about 1% and about 99% hydrogen, such as between about 70% and about 99% hydrogen, preferably about 95% hydrogen, balance inert gas. In preferred embodiments, the temperature during exposure to the reducing atmosphere is preferably between about 800° C. and about 1200° C., such as about 1000° C. The pressure is preferably sub-atmospheric, such as less than about 10000 Pa (less than 100 Torr), preferably less than about 1000 Pa (less than 1 Torr), preferably less than about 1 Pa (less than 0.01 Torr), even more preferably less than about 0.1 Pa (less than 0.001 Torr), and even more preferably less than about 0.01 Pa (less than 0.0001 Torr). The cleaning anneal may adjust the grain size of the metal film, e.g., increase the grain size at elevated temperatures.

According to some embodiments of the method of the present invention, the multilayer structure may be exposed to a carbon source, whereby the atomic carbon diffuses into the bulk region of the metal film. Atomic carbon may be solubilized in metal films comprising metals having high solubility for carbon, e.g., nickel, or may migrate between metal grains in metal films comprising metals having low solubility for carbon, e.g., copper. In some embodiments, a carbon-containing gas or a carbon-containing vapor flow may be added to the reducing gas flow. The carbon-containing gas may be selected from among volatile hydrocarbons, for example, methane, ethane, ethylene, acetylene, propane, propylene, propyne, butane, isobutane, butylenes, butynes, and the like. The carbon-containing vapor may be selected from liquid hydrocarbons, for example, cyclohexane, benzene, pentane, hexane, heptane, and the like. It is noted that these hydrocarbon gas or liquid can be saturated hydrocarbon, or non-saturated hydrocarbon. The carbon-containing gas, e.g., methane, is a source of carbon that may precipitate into graphene according to the process of the present invention. The atmosphere may be a reducing atmosphere, further comprising a reducing gas, such as hydrogen. In some embodiments, the gas may comprise methane gas and hydrogen gas in a ratio from about 1:1 to about 200:1, such as between about 1:1 and about 100:1, such as about 144:15. The minimum temperature during carbon absorption and/or adsorption is generally at least about 500° C. The maximum temperature during carbon absorption and/or adsorption is generally no more than about 1100° C. In general, the temperature is preferably between about 700° C. and about 1000° C. In general, the pressure inside the reaction chamber during hydrogen gas/methane flow is between about 10 Pa (about 0.1 Torr) and about 1500 Pa (about 100 Torr), such as between about 50 P (about 0.4 Torr) and about 150 Pa (about 1 Torr).

Optionally, and preferably, after sufficient carbon has in-diffused into the bulk region of the metal film, the flow of gases is stopped and the multilayer is held at the temperature of in-diffusion for a sufficient duration to allow the carbon to distribute throughout the bulk region of the metal film. The proper duration for carbon in-diffusion to yield a product having the desired number of mono-atomically thick graphene layers may be determined by creating a calibration curve in which the number of layers of the segregated graphene in the final product is a function of the carbon in-diffusion duration. The calibration curve may be used to determine ideal carbon in-diffusion durations sufficient to yield a single mono-atomically thick graphene layer or multiple mono-atomically thick graphene layers. The duration of equilibration after the flow of carbon-containing gas is stopped may range from about 5 seconds to about 3600 seconds, such as about 600 seconds to about 1800 seconds. In some embodiments, the duration of carbon in diffusion is very short, such as about 10 seconds. After the metal absorbs a sufficient concentration of carbon, the multilayer structure is cooled to thereby segregate and precipitate graphene during cooling.

In some embodiments, in addition to the carbon-containing gas or vapor or as an alternative to the carbon-containing gas, carbon may be provided in solid form as either a carbon-containing self-assembled monolayer and/or a carbon-rich polymer. Herein, the hydrocarbon-containing moiety acts as a source of carbon (or B and/or N), which will in-diffuse into the previously or subsequently applied metal film during a heating cycle or degrade into graphene (or doped graphene) wherein the metal film comprises a metal having low or substantially zero carbon solubility. The hydrocarbon provides a carbon source for graphene formation on the intervening layer of boron nitride deposited on the front surface layer of the semiconductor substrate.

In general, a wide variety of carbon-containing polymers are suitable. In some embodiments, the carbon-rich polymer may be selected from the group consisting of polymethylmethacrylate (PMMA), polybutadiene, polystyrene, poly(acrylonitrile-co-butadiene-co-styrene) (ABS), polyethylene, polypropylene, poly(4'-vinylhexaphenylbenzene)s, and combinations thereof. In some embodiments, the polymer or carbon-containing film may contain nitrogen or boron in order to produce nitrogen-doped or boron-doped graphene sheets. Nitrogen-containing polymers suitable for the present invention include melamine formaldehyde, polyacrylonitrile, poly(2,5 pyridine), polypyrrole, polycarbazole, polyaniline, and combinations thereof. Boron doping may be achieved by preparing a carbon-containing layer comprising boron alcohols (non-polymeric) or by depositing Boramer™.

The carbon-rich polymer may be deposited by spin coating the substrate with a polymer film from a polymer-containing solution. Other suitable deposition methods include spray coating and electrochemical deposition. Suitable solvents for the spin-coating solution include toluene, hexane, xylene, pentane, cyclohexane, benzene, chloroform. The polymer concentration is generally between about 0.01 wt. % and about 1 wt. %, between about 0.05 wt. % and about 0.5 wt. %, such as about 0.1 wt. %.

The carbon-rich polymer layer may be deposited to a thickness between about 1 nanometer and about 100 nanometers thick, such as between about 5 nanometer and about 100 nanometers thick, preferably between about 10 nanometers and about 50 nanometers thick. In some embodiments, the carbon-rich polymer layer may be deposited to a thickness between about 1 nanometer and about 10 nanometers.

The temperature during carbon in-diffusion may range from about 500° C. to about 1000° C., such as from about 700° C. to about 1000° C., such as from about 800° C. for iron or about 1000° C. for nickel. After the metal absorbs a sufficient concentration of carbon, the multilayer structure is cooled to thereby segregate and precipitate graphene during cooling.

Thereafter, the multilayer structure is rapidly cooled. Cooling the multilayer structure lowers the solubility of carbon within the bulk region of the metal film, which forces the carbon to segregate from the metal film and precipitate graphene between the boron nitride layer and the back surface of the metal film. The cooling rate may be at least about 10° C./min, at least about 50° C./min, at least about 100° C./min. In general, the pressure inside the reaction chamber during cooling is between about 10 Pa (about 0.1 Torr) and about 1500 Pa (about 100 Torr), such as between about 50 P (about 0.4 Torr) and about 150 Pa (about 1 Torr). The atmosphere is preferably a reducing atmosphere, which may comprise between about 1% and about 99% hydrogen, such as between about 70% and about 99% hydrogen, preferably about 95% hydrogen, balance inert gas. High temperature growth and rapid cooling enhance the precipitation and surface nucleation fast so that graphene nuclei tries to attach each other preferentially in the same orientation resulting epitaxial growth of large coverage, high quality single-layer graphene.

In embodiments wherein the solubility of carbon in a metal is low or zero (e.g., Copper), the method of the present invention advantageously yields a monolayer of graphene. In embodiments wherein graphene formation depends upon solubilization of carbon into the metal film followed by segregation and precipitation of graphene (e.g., Nickel, Cobalt), the method of the present invention requires control of the amount of carbon absorbed and precipitated to control the number of graphene layers produced. In some embodiments, the method of the present invention enables deposition of a single mono-atomic layer of graphene between the boron nitride layer on the front surface of the semiconductor substrate and the back surface of the metal film. In some embodiments, the method of the present invention enables deposition of multiple layers of mono-atomically thick graphene between the boron nitride layer on the front surface of the semiconductor substrate and the back surface of the metal film. The graphene layer may comprises between two and about 100 layers of mono-atomically thick graphene, such as between two and about 50 layers of mono-atomically thick graphene, or between three and about 50 layers of mono-atomically thick graphene. A second layer of graphene may precipitate at the front metal film surface. Current results to date have shown that nickel layers in particular are suitable for preparing multi-layer graphene films.

According to embodiments wherein a graphene layer precipitates upon the front metal film surface, this exterior layer or layers of graphene may be removed. In some embodiments, the exterior graphene layer or layers may be removed by etching, for example, wet etching, plasma etching, or oxidation in ozone/UV light. In preferred embodiments, the exterior layer or layers of graphene may be removed by oxygen plasma etching.

According to some embodiments the next step of the present invention, the metal film is removed to thereby expose the graphene layer in contact with the boron nitride layer, which in turn is in contact with the front surface of the semiconductor substrate. The metal film may be removed by techniques known in the art adequate to dissolve the metal of the metal film, e.g., dissolution of nickel, copper, iron, or alloys thereof. In preferred embodiments, the metal film is contacted with an aqueous metal etchant. Metal etchants useful for removing the metal film include ferric chloride, iron (III) nitrate, aqua-regia, and nitric acid. Advantageously, these metal etchants will not remove graphene.

Figure 1E:
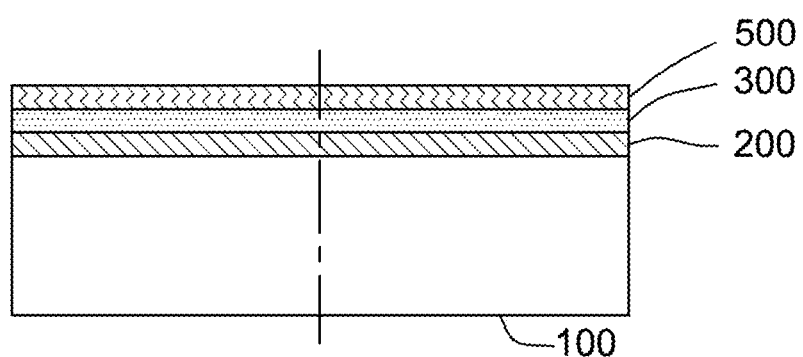

In some embodiments, upon removal of the metal film, a multilayer substrate is produced comprising a semiconductor substrate 100 (e.g., a silicon wafer comprising a silicon oxide layer and/or a silicon nitride layer), a dielectric layer 200, a layer of boron nitride 300, and a single layer or multi-layer 500 of graphene of mono-atomic thickness. See FIG. 1E. In some embodiments, one or both of the graphene and boron nitride layers may comprise multilayers of each material, each layer having a mono-atomic thickness. The graphene layer may be characterized to confirm the number of layers by techniques known in the art, for example, Raman spectroscopy.

In summary, the present invention provides a fundamental understanding of the h-BN growth kinetics on Si surface, Si-based oxide ($SiO_2$/Si) and nitride ($Si_3N_4$/Si) surfaces. The present disclosure provides the details of the growth mechanism supported by molecular dynamics simulations, where the nitrogen on $Si_3N_4$/Si surfaces binds with active species of boron and nitrogen to produce nucleation sites for adsorption kinetics-assisted growth of large-area and continuous films of h-BN. The impact of kinetic processes in h-BN synthesis on non-metal catalyzed surfaces ($SiO_2$/Si and $Si_3N_4$/Si) under LPCVD conditions was untangled. Further, the large-area, van der Waals bound, and electronically isolated graphene/h-BN heterostructure were also designed. Interestingly, the low-temperature electronic transport studies reveal that the graphene/h-BN heterostructure exceptionally performs in terms of charge carrier mobility (3 folds enhancement) and electron-hole puddling fluctuations compared to graphene/$Si_3N_4$/Si counterpart. Unlike the transition metal-assisted hBN formations, the method developed here i.e. the versatile process of direct and scalable production of h-BN is more compatible with current semiconductor industry. The process developed here can potentially be envisioned to include a variety of intelligently designed 3D heterostructures via 2DNs with applications ranging from nano-scale electronics to energy conversion and optoelectronics.

EXAMPLES

The following non-limiting examples are provided to further illustrate the present invention.

Example 1. Synthesis of Hexagonal Boron Nitride (h-BN) on Si-Based Nitride ($Si_3N_4$/Si) Substrates The h-BN synthesis was performed via low-pressure CVD (LPCVD) system (MTI OTF-1200X) with a specially designed separate chamber for ammonia-borane (AB). The $Si_3N_4$/Si substrates (supplied by SunEdison Semiconductor) were cleaned using piranha solution (a volumetric mixture of 3:1 of 98% $H_2SO_4$ to 35% $H_2O_2$). For h-BN synthesis, the $Si_3N_4$ substrates were directly placed in the center of quartz tube's heating zone and heated to 1100° C. in $H_2$ atmosphere to restrict further oxidation. After tube heating zone reached 1100° C., the AB was sublimed at ~100° C. and further it was transported to the chamber containing the substrate via supplied $H_2$ carrier gas. The h-BN synthesis takes place at a pressure of 5-10 Torr and the reaction time was varied from 15 to 60 min followed by fast cooling (≈100° C./min). The synthesized thin films of h-BN were characterized by a combined confocal Raman-atomic force microscopy (Raman-AFM, WITEC α-300RA with laser wavelength of 532 nm) and X-ray photoelectron spectroscopy (XPS, Kratos AXIS-165). For the AFM measurement of h-BN surface roughness and film thickness, the h-BN on $Si_3N_4$ surface was patterned through micro-fabrication etching processes: E-beam evaporation (Varian), UV-photolithography (Karl Suss MA6) and Reactive Ion Etching (RIE, Oxford Instruments).

Example 2. Graphene Synthesis by Chemical Vapor Deposition of Graphene on Cu Foil High quality monolayer graphene was grown via chemical vapor deposition (CVD) process on a (1"×2") copper foil (25 μm, 99.98% purity) using $CH_4$ (99.95% purity, Praxair) as carbon feedstock, and $H_2$ (99.9999%, Praxair) as reduction gas. A standard 1-inch quartz tube in a split CVD furnace (MTI OTF-1200X) was used as reaction chamber. The typical graphene synthesis was as follows. First, the copper foil was thoroughly washed with copious amount of water, acetone, and IPA (in the order). The native oxide of Cu foil was then removed by submerging in solution of $Fe(NO_3)_2$:$HNO_3$ (1M:3M) for 10 minutes. Subsequently, the Cu foil was continuously rinsed with copious amount of water, acetone, and IPA (in the order). In order to further remove the remaining ion, the Cu foil was sonicated in 100 mL of acetone (ACS spectrophotometric grade, ≥99.5%, Fisher Scientific). Then the foil was thoroughly washed with copious amount water, acetone, and IPA (in the order), and then dried by purified air flow for 2 minutes. Further, the clean foil was loaded into the CVD furnace, and the reaction chamber was evacuated to 1 mTorr in 5 minutes. Next, 100 sccm of $H_2$ was introduced in order to flush the system for another 10 minutes. The furnace temperature was increased to 1050° C. in 15 minutes, while maintaining the $H_2$ gas flow. At 1050° C., the Cu foil was further annealed for 30 minutes to increase the grain size, and to smoothen its surface. Then 10 sccm of $CH_4$ was introduced into the chamber for 1 minute (PTot=500 mTorr). After the growth, the $CH_4$ was turned off, and the chamber was quickly cooled down to room temperature by opening the half furnace.

Example 3. Graphene Transfer to h-BN/$Si_3N_4$/Si and $Si_3N_4$Si Substrates

The graphene transfer process was used as followed. First, 25 mg/mL of poly(methyl methacrylate) (PMMA) (MW 996,000, Sigma Aldrich) in anisole (99% purity, Acros Organics) was spin-coated onto the graphene/Cu foil at (i) pre-spin: at 500 RPM for 5 second (500 rpm/s ramp rate), and (ii) full-spin: at 4000 RPM for 30 second (1000 rpm/s ramp rate). The PMMA-coated graphene/Cu foil was then air dried for 5 minutes, followed by etching the Cu foil with 1 mL:3 mL of $HNO_3$ (65% purity) and DI water for 1 h. The floating PMMA/graphene sample was picked up by submerging a clean quartz substrate into the solution, and lifting up at 60° angle to the surface of etchant solution. Immediately it was transferred into DI water at the same manner as picking up step (repeated twice). Similarly, the subsequent substrates (SiN, and direct grown hBN) were then used to pick up the PMMA/graphene samples. These PMMA/graphene/SiN/n++—Si, and PMMA/graphene/hBN/SiN/n++—Si were left to dry overnight in the air. To remove the PMMA, these samples were submerged into acetone for 10 minutes at room temperature, followed by washing with copious amount of acetone, and IPA (in the order), and dried with purified air flow for 2 minutes.

Example 4. Field-Effect Transistor (FET) Device Fabrications and Electrical Measurements Photolithography: After transferring to highly n++ silicon substrates with different dielectric layers (SiN, and hBN/SiN), the graphene samples were deposited with Cr/Au (15 nm/95 nm) layers. A positive photoresist (AZ 1818) was spin-coated onto the samples at 4000 rpm for 45 second. The samples were then baked on the hot plate at 110° C. for 1 minute. Subsequently, a dose of UV light (365 nm and lamp power of 900 W) was introduced into the samples with aligned mask for 12 second using Karl Suss MA6 mask aligner. Then samples were developed in a solution of 3:1 (DI water: AZ 340) for 18 seconds followed by etching the un-protected Cr/Au area to form the electrode contact in Au etchant (36 seconds), and Cr etchant (18 seconds) at room temperature in the order. After defining the metal contact, the samples were washed with copious amount of acetone and IPA (in the order), and dried with purified air flow for 2 minutes.

The bar structure with a channel length of 27 μm and channel width of 7 μm was fabricated by repeating previous steps with another layer of positive photoresist. After developing to form a protected pattern of graphene bar, these samples were placed inside Oxford RIE chamber to remove the non-protected graphene via oxygen plasma (10 W power, 20 s exposure, 535-550 V peak to peak voltage, and 260 V bias voltage). Subsequently, the covered photoresists were removed by submerging the samples into the first bath of AZ 351 solution for 5 minutes, into the second bath of AZ 351 solution for another 3 minutes to further remove the photoresist residues, and into IPA solution for 5 minutes. Finally, the samples were washed with copious amount of acetone and IPA (in the order), and dried with purified air flow for 2 minutes.

Device Pre-Treatment, and Electrical Measurement: Prior to electrical measurement, the sample was placed into a clean 1" quartz tube in a split furnace. The chamber was evacuated to 1 mTorr in 5 minutes. Further, 20 sccm of $H_2$ was introduced to flush the system for another 10 minutes. The furnace temperature was increased to 150° C. in 15 minutes, while manning the flow of $H_2$ at 200 mTorr. At 150° C. the photoresist residues were further removed by reducing gas ($H_2$) for 2 h. After cooling down to room temperature, the samples were immediately placed inside the Janis Cryostat system for electrical measurements.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:
1. A multilayer structure comprising:
a single crystal semiconductor wafer comprising two major, generally parallel surfaces, one of which is a front surface of the single crystal semiconductor wafer and the other of which is a back surface of the single crystal semiconductor wafer, a circumferential edge joining the front and back surfaces of the single crystal semiconductor wafer, a central plane between the front surface and the back surface of the single crystal semiconductor wafer, and a bulk region between the front and back surfaces of the single crystal semiconductor wafer;
a layer comprising N-terminated (100) silicon nitride in interfacial contact with the front surface of the single crystal semiconductor wafer;
a layer comprising hexagonal boron nitride in interfacial contact with the layer comprising silicon nitride; and
a layer comprising graphene in interfacial contact with the layer comprising hexagonal boron nitride, the layer comprising graphene characterized by a ratio $I_{2D}/I_G$ of at least about 3, wherein $I_G$ is a full-width at half maxima of G-band, $I_{2D}$ is a full-width at half maxima of 2D-band position, and the ratio of the intensities of the 2D and G bands ($I_{2D}/I_G$) is determined via confocal Raman spectroscopy.
2. The multilayer structure of claim 1 wherein the single crystal semiconductor wafer comprises a material selected from the group consisting of silicon, silicon carbide, silicon germanium, gallium arsenide, gallium nitride, indium phosphide, indium gallium arsenide, germanium, and combinations thereof.

3. The multilayer structure of claim 1 wherein the single crystal semiconductor wafer comprises silicon.

4. The multilayer structure of claim 1 wherein the layer comprising N-terminated (100) silicon nitride is neutrally charged.

5. The multilayer structure of claim 1 wherein the hexagonal boron nitride has a molar ratio of B:N is between about 1.3:1 and 1:1.3.

6. The multilayer structure of claim 1 wherein the hexagonal boron nitride has an atomic concentration ratio of nitrogen and boron is 1:1.11±0.09.

7. The multilayer structure of claim 1 wherein the layer comprising graphene has a field effect mobility from about 500 cm$^2$ V$^{-1}$ s$^{-1}$ to about 1300 cm$^2$ V$^{-1}$ s$^{-1}$.

8. The multilayer structure of claim 1 wherein the layer comprising graphene has an intrinsic charge carrier mobility of at least about 1200 cm$^2$/Vs.

9. The multilayer structure of claim 1 further comprising a metal film in interfacial contact with the layer comprising graphene.

10. The multilayer structure of claim 9 wherein the metal film comprises a metal selected from the group consisting of nickel, copper, iron, platinum, palladium, ruthenium, aluminum, cobalt and alloys thereof.

11. The multilayer structure of claim 9 wherein the metal film comprises nickel, cobalt, or nickel and cobalt.

12. The multilayer structure of claim 9 wherein the metal film comprises copper.

13. The multilayer structure of claim 1, wherein the layer comprising hexagonal boron nitride is prepared by a process comprising:

contacting a front surface of the layer comprising silicon nitride with (i) a boron-containing gas or a boron-containing vapor and (ii) a nitrogen-containing gas or nitrogen-containing vapor at a temperature sufficient to directly deposit the layer comprising hexagonal boron nitride in interfacial contact with the front surface of the layer comprising silicon nitride.

* * * * *